(12) United States Patent
Pu et al.

(10) Patent No.: US 12,713,816 B2
(45) Date of Patent: Aug. 18, 2026

(54) DISPLAY PANEL IN WHICH ORTHOGRAPHIC PROJECTION OF LENS LAYER ON SUBSTRATE IS LOCATED WITHIN AREA DELINEATED BY OUTER CONTOUR OF ORTHOGRAPHIC PROJECTION OF CATHODE RING ON SUBSTRATE, DISPLAY DEVICE AND WEARABLE DEVICE

(71) Applicants: Yunnan Invensight Optoelectronics Technology Co., Ltd., Kunming (CN); BOE Technology Group Co., Ltd., Beijing (CN)

(72) Inventors: Chao Pu, Beijing (CN); Shengji Yang, Beijing (CN); Junyan Yang, Beijing (CN); Xiaochuan Chen, Beijing (CN); Kuanta Huang, Beijing (CN); Pengcheng Lu, Beijing (CN); Dachao Li, Beijing (CN); Rongrong Shi, Beijing (CN); Junbo Wei, Beijing (CN); Xiao Bai, Beijing (CN); Bo Yang, Beijing (CN)

(73) Assignees: Yunnan Invensight Optoelectronics Technology Co., Ltd., Kunming (CN); BOE TECHNOLOGY GROUP CO., LTD., Beijing (CN)

( * ) Notice: Subject to any disclaimer, the term of this patent is extended or adjusted under 35 U.S.C. 154(b) by 424 days.

(21) Appl. No.: 18/278,913

(22) PCT Filed: Oct. 18, 2022

(86) PCT No.: PCT/CN2022/125966

§ 371 (c)(1),
(2) Date: Aug. 25, 2023

(87) PCT Pub. No.: WO2024/082142

PCT Pub. Date: Apr. 25, 2024

(65) Prior Publication Data

US 2024/0130202 A1 Apr. 18, 2024

(51) Int. Cl.
*H10K 59/80* (2023.01)

(52) U.S. Cl.
CPC ..... *H10K 59/879* (2023.02); *H10K 59/80521* (2023.02)

(58) Field of Classification Search
CPC ........... H10K 59/879; H10K 59/80521; H10K 50/822; H10K 50/858
See application file for complete search history.

(56) References Cited

U.S. PATENT DOCUMENTS

2007/0175582 A1 8/2007 Baek et al.
2009/0038749 A1 2/2009 Kim et al.
(Continued)

FOREIGN PATENT DOCUMENTS

CN 110544714 A 12/2019
CN 110928016 A 3/2020
(Continued)

*Primary Examiner* — Tracie Y Green
(74) *Attorney, Agent, or Firm* — WHDA, LLP

(57) ABSTRACT

A display panel includes an active area and a peripheral area surrounding the active area, and the display panel further includes: a substrate and a plurality of light emitting devices arranged on the substrate in array, wherein the plurality of light emitting devices are located at least in the active area; a conducting layer comprising a cathode ring and cathodes of the plurality of light emitting devices, wherein the cathode ring is located in the peripheral area, and the cathode ring surrounds the active area; and a lens layer located at a side of the light emitting devices away from the substrate, wherein the lens layer extends from the active area to the peripheral area; wherein an orthographic projection of the lens layer on the substrate is located within an area delin- (Continued)

eated by an outer contour of an orthographic projection of the cathode ring on the substrate.

19 Claims, 8 Drawing Sheets

(56) References Cited

U.S. PATENT DOCUMENTS

| | | | | |
|---|---|---|---|---|
| 2016/0276419 | A1 | 9/2016 | Lim et al. | |
| 2016/0372704 | A1 | 12/2016 | Lee et al. | |
| 2019/0006616 | A1* | 1/2019 | Nishimura | H10K 59/8722 |
| 2019/0014266 | A1 | 1/2019 | Cho et al. | |
| 2021/0074597 | A1 | 3/2021 | Ka et al. | |
| 2022/0020827 | A1* | 1/2022 | Liu | H10K 71/00 |
| 2022/0085124 | A1 | 3/2022 | Sui et al. | |
| 2022/0131110 | A1* | 4/2022 | Ishizuya | H10K 59/878 |
| 2022/0344405 | A1 | 10/2022 | Zhu et al. | |
| 2022/0384747 | A1 | 12/2022 | Sun et al. | |
| 2024/0172480 | A1* | 5/2024 | Yuan | H10K 59/1201 |
| 2024/0196655 | A1* | 6/2024 | Wei | G09G 3/3233 |

FOREIGN PATENT DOCUMENTS

| | | | |
|---|---|---|---|
| CN | 111029397 | A | 4/2020 |
| CN | 111341808 | A | 6/2020 |
| CN | 112420973 | A | 2/2021 |
| CN | 113192830 | A | 7/2021 |
| CN | 113972336 | A | 1/2022 |
| CN | 114497134 | A | 5/2022 |
| CN | 115064567 | A | 9/2022 |
| KR | 20070079429 | A | 8/2007 |
| KR | 20090014475 | A | 2/2009 |
| KR | 20160113447 | A | 9/2016 |
| KR | 20160150258 | A | 12/2016 |
| KR | 20160150260 | A | 12/2016 |
| KR | 20180030286 | A | 3/2018 |
| KR | 20200061277 | A | 6/2020 |
| WO | 2019/006828 | A1 | 1/2019 |

* cited by examiner

DISPLAY PANEL IN WHICH ORTHOGRAPHIC PROJECTION OF LENS LAYER ON SUBSTRATE IS LOCATED WITHIN AREA DELINEATED BY OUTER CONTOUR OF ORTHOGRAPHIC PROJECTION OF CATHODE RING ON SUBSTRATE, DISPLAY DEVICE AND WEARABLE DEVICE

TECHNICAL FIELD

The present application relates to the technical field of displaying and more particularly, to a display panel, a display device, and a wearable device.

BACKGROUND

With the continuous development of display technology, silicon-based Organic Light Emitting Diode (OLED) display products have attracted widespread attention due to their advantages such as high resolution, low power consumption, small size, and light weight. It has good application prospects in high-resolution near-to-eye display industries such as wearable devices, industrial security, and healthcare.

SUMMARY

Embodiments of the present application employ the following technical solutions:

In a first aspect, an embodiment of the present application provides a display panel, including an active area and a peripheral area, wherein the peripheral area surrounds the active area, and the display panel further includes:

- a substrate and a plurality of light emitting devices arranged on the substrate in array, wherein the plurality of light emitting devices are located at least in the active area;
- a conducting layer including a cathode ring and cathodes of the plurality of light emitting devices, wherein the cathode ring is located in the peripheral area, and the cathode ring surrounds the active area; and
- a lens layer located at a side of the light emitting devices away from the substrate, wherein the lens layer extends from the active area to the peripheral area;
- wherein an orthographic projection of the lens layer on the substrate is located within an area delineated by an outer contour of an orthographic projection of the cathode ring on the substrate.

In a display panel provided by an embodiment of the present application, the orthographic projection of the lens layer on the substrate is located within an area delineated by an inner contour of the orthographic projection of the cathode ring on the substrate, and an outer contour of the orthographic projection of the lens layer on the substrate is located in the peripheral area.

In a display panel provided by an embodiment of the present application, the outer contour of the orthographic projection of the lens layer on the substrate overlaps with the inner contour of the orthographic projection of the cathode ring on the substrate.

In a display panel provided by an embodiment of the present application, a gap is provided between the outer contour of the orthographic projection of the lens layer on the substrate and the inner contour of the orthographic projection of the cathode ring on the substrate.

In a display panel provided by an embodiment of the present application, a size of the gap in a direction from the active area pointing to the peripheral area is less than or equal to a width of the cathode ring in the direction from the active area pointing to the peripheral area.

In a display panel provided by an embodiment of the present application, the size of the gap in the direction from the active area pointing to the peripheral area is greater than or equal to a size of one of the plurality of light emitting devices in the direction from the active area pointing to the peripheral area.

In a display panel provided by an embodiment of the present application, a part of the plurality of light emitting devices are located in the peripheral area, the light emitting devices located in the peripheral area are arranged in one circle along the edge of the active area, and the orthographic projection of the cathode ring on the substrate is located at a side, away from the active area, of an orthographic projection of each light emitting device located in the peripheral area on the substrate;

- wherein the orthographic projections of the light emitting devices located in the peripheral area on the substrate is located within the orthographic projection of the lens layer on the substrate.

In a display panel provided by an embodiment of the present application, the peripheral area includes a first peripheral subarea, a second peripheral subarea, a third peripheral subarea and a fourth peripheral subarea, the fourth peripheral subarea is disposed opposite to the first peripheral subarea, the second peripheral subarea is disposed opposite to the third peripheral subarea, and the fourth peripheral subarea includes a binding terminal; and

- a width of a portion of the cathode ring located in the fourth peripheral subarea in a direction from the active area pointing to the peripheral area is less than or equal to widths of a portion of the cathode ring located in the peripheral area other than the fourth peripheral subarea in the direction from the active area pointing to the peripheral area.

In a display panel provided by an embodiment of the present application, the width of the portion of the cathode ring located in the fourth peripheral subarea in the direction from the active area pointing to the peripheral area is less than a width of a portion of the cathode ring located in the first peripheral subarea in the direction from the active area pointing to the peripheral area.

In a display panel provided by an embodiment of the present application, a graph of the orthographic projection of the lens layer on the substrate includes a first side and a second side that are opposite to each other, an inner contour of a graph of the orthographic projection of the cathode ring on the substrate includes a first edge and a second edge that are opposite to each other, the first side and the first edge are located in the second peripheral subarea, and the second side and the second edge are located in the third peripheral subarea; and

- a minimum distance between the first side and the first edge is different from a minimum distance between the second side and the second edge.

In a display panel provided by an embodiment of the present application, a graph of the orthographic projection of the lens layer on the substrate includes a first side and a second side that are opposite to each other, an inner contour of a graph of the orthographic projection of the cathode ring on the substrate includes a first edge and a second edge that are opposite to each other, the first side and the first edge are located in the second peripheral subarea, and the second side and the second edge are located in the third peripheral subarea; and a minimum distance between the first side and the first edge is equal to a minimum distance between the second side and the second edge; and a width of a portion of the cathode ring located in the second peripheral subarea in the direction from the active area pointing to the peripheral area is different from a width of a portion of the cathode ring located in the third peripheral subarea in the direction from the active area pointing to the peripheral area.

In a display panel provided by an embodiment of the present application, a graph of the orthographic projection of the lens layer on the substrate includes a first side and a second side that are opposite to each other, an inner contour of a graph of the orthographic projection of the cathode ring on the substrate includes a first edge and a second edge that are opposite to each other, the first side and the first edge are located in the second peripheral subarea, and the second side and the second edge are located in the third peripheral subarea; and a minimum distance between the first side and the first edge is equal to a minimum distance between the second side and the second edge; and a width of a portion of the cathode ring located in the second peripheral subarea in the direction from the active area pointing to the peripheral area is equal to a width of a portion of the cathode ring located in the third peripheral subarea in the direction from the active area pointing to the peripheral area.

In a display panel provided by an embodiment of the present application, the lens layer includes a plurality of first lenses and a plurality of second lenses, the plurality of first lenses are located in the active area, and the plurality of second lenses are located in the peripheral area; and a height of each of the plurality of second lenses in a direction perpendicular to a plane where the substrate is located is less than or equal to a height of each of the plurality of first lenses in the direction perpendicular to the plane where the substrate is located.

In a display panel provided by an embodiment of the present application, in the direction from the active area pointing to the peripheral area, heights of the plurality of second lenses gradually decrease in the direction perpendicular to the plane where the substrate is located.

In a display panel provided by an embodiment of the present application, shapes of graphs of orthographic projections of the second lenses on the substrate include ellipses, and extension directions of long axes of at least part of the ellipses in the peripheral area are different.

In a display panel provided by an embodiment of the present application, shapes of graphs of orthographic projections of the first lenses on the substrate include ellipses, and extension directions of long axes of at least part of the ellipses in the active area are the same.

In a display panel provided by an embodiment of the present application, structures and sizes of the first lenses located at one side of an intersection boundary of the active area and the peripheral area are the same as structures and sizes of the second lenses located at the other side of the intersection boundary.

In a display panel provided by an embodiment of the present application, shapes of graphs of orthographic projections of the first lens and the second lens on the substrate both include ellipses, and extension directions of long axes of the graphs of the orthographic projections of the first lenses located at one side of the intersection boundary are the same as extension directions of long axes of the graphs of the orthographic projections of the second lenses located at the other side of the intersection boundary.

In a display panel provided by an embodiment of the present application, the display panel includes a first encapsulation layer, a color filter layer and a second encapsulation layer that are arranged in sequence, the first encapsulation layer covers the light emitting devices and the cathode ring and extends to the peripheral area, the second encapsulation layer is located between the color filter layer and the lens layer, and the second encapsulation layer further extends to the peripheral area; and a roughness of at least part area of a surface of the second encapsulation layer away from the substrate is greater than a roughness of a surface of the first encapsulation layer away from the substrate.

In a display panel provided by an embodiment of the present application, the roughness of at least part area of the surface of the second encapsulation layer away from the substrate is greater than or equal to ten times the roughness of the surface of the first encapsulation layer away from the substrate.

In a display panel provided by an embodiment of the present application, the display panel further includes a bonding layer and a cover plate, the bonding layer is located at a side of the lens layer away from the substrate, the cover plate is located at a side of the bonding layer away from the lens layer, an orthographic projection of the bonding layer on the substrate is located within an orthographic projection of the second encapsulation layer on the substrate, and the bonding layer is in direct contact with a part area of the second encapsulation layer and the lens layer.

In a display panel provided by an embodiment of the present application, an area of a region, in direct contact with the second encapsulation layer, of a portion of the bonding layer located in the fourth peripheral subarea is greater than or equal to an area of a region, in direct contact with second encapsulation layer, of a portion of the bonding layer located in the first peripheral subarea.

In a display panel provided by an embodiment of the present application, the display panel further includes a light shield layer, the light shield layer is located in the peripheral area and surrounds the active area, and the light shield layer and the color filter layer are arranged in a same layer; and the orthographic projection of the cathode ring on the substrate is located within an orthographic projection of the light shield layer on the substrate, the outer contour of the orthographic projection of the lens layer on the substrate falls into an area where an orthographic projection of the light shield layer on the substrate is located, and an orthographic projection of an outer contour of the light shield layer on the substrate is located within an orthographic projection of the cover plate on the substrate.

In a display panel provided by an embodiment of the present application, a shape of a graph of the orthographic projection of the cathode ring on the substrate includes polygons with rounded corners.

In a display panel provided by an embodiment of the present application, the display panel further includes a plurality of positive electrodes located in the peripheral area, and the plurality of positive electrodes and anodes of the light emitting devices are arranged in a same layer;

wherein the positive electrodes are electrically connected to the anodes, and the positive electrodes are in direct contact with the cathode ring.

In a second aspect, an embodiment of the present application provides a display device, including the display panel as described in the first aspect.

In a third aspect, an embodiment of the present application provides a wearable device, including two display devices as described in the second aspect.

The above description is merely a summary of the technical solutions of the present application. In order to more clearly know the technological means of the present application to enable the implementation according to the contents of the specification, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the figures that are required to describe the embodiments or the related art will be briefly described below. Apparently, the figures that are described below are embodiments of the present application, and a person skilled in the art can obtain other figures according to these figures without paying creative work.

DETAILED DESCRIPTION

Figure 1:
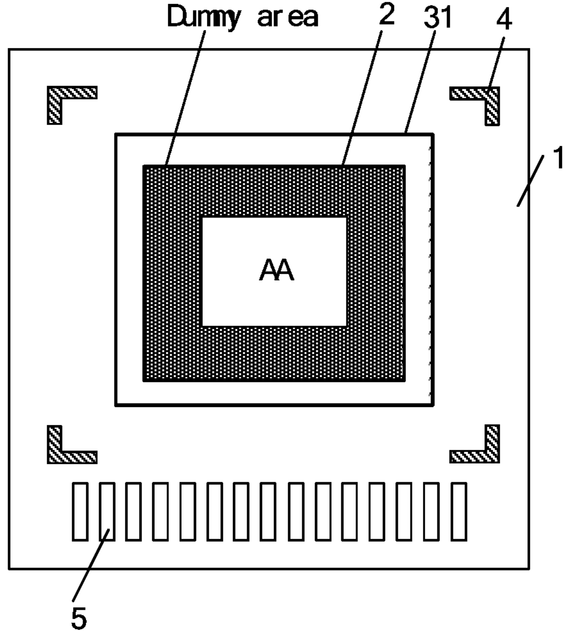
FIG. 1 to FIG. 5 are plane schematic diagrams of five types of display panels according to embodiments of the present application.

The technical solutions according to the embodiments of the present application will be clearly and completely described below with reference to the drawings according to the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

Unless the context otherwise requires, in the entire specification and claims, the term "including" is interpreted as open and inclusive, meaning "including, but not limited to". In the description of the specification, the terms "one embodiment," "some embodiments," "exemplary embodiments," "examples," "specific examples," or "some examples," etc. are intended to indicate that specific features, structures, materials, or characteristics related to the embodiment or example are included in at least one embodiment or example of the present application. The schematic representation of the above terms may not necessarily refer to the same embodiment or example. In addition, the specific features, structures, materials, or features described may be included in any one or more embodiments or examples in any appropriate manner.

In addition, it should be noted that when introducing the elements and embodiments of the present application, the articles "a", "an", "this" and "the" are intended to indicate the existence of one or more elements. Unless otherwise specified, "a plurality of" means two or more; the terms "including", "comprising", "containing", and "having" are intended to include and indicate the existence of elements other than those listed; the terms "first", "second", "third", etc. are only used for descriptive purposes and cannot be understood as indicating or implying relative importance or order of formation.

In the specification, "electrical connection" includes the situation where the constituent elements are connected together through components with a certain electrical effect. There are no special restrictions on "components with a certain electrical effect", as long as they can perform the transmission and reception of electrical signals between the connected constituent elements. Examples of "components with a certain electrical effect" include not only electrodes and wirings, but also switching components such as transistors, resistors, inductors, capacitors, and other components with various functions.

Polygons in this specification are not strictly defined, but can be approximate triangles, rectangles, trapezoids, pentagon or hexagons, etc. There can be some small deformations caused by tolerances, and there can be chamfers, fillets, arc edges and deformations, etc.

With the continuous development of display technology, silicon-based Organic Light Emitting Diode (OLED) display products have the characteristics of small size and high resolution. Its backplane is made using mature integrated circuit Complementary Metal Oxide Semiconductor (CMOS) technology, achieving active addressing of pixels, including various circuits such as Timer Control Register (TCON) and Over Current Protection (OCP), which can achieve lightweight. The silicon-based OLED display products are widely used in the fields of near-to-eye displays, Virtual Reality (VR), and Augmented Reality (AR).

Therefore, the embodiment of the present application provides a newly designed display panel, display device, and wearable device, to improve the product reliability of silicon-based display devices, extend their service life, expand usage scenarios of silicon-based display products, and enable them to have deeper applications in high-resolution near-to-eye display industries such as wearable devices, industrial security, and healthcare. The display panel includes an active area and a peripheral area, the peripheral area surrounds the active area, and the display panel further includes: a substrate and a plurality of light emitting devices arranged on the substrate in array, wherein the plurality of light emitting devices are located at least in the active area; a conducting layer including a cathode ring and cathodes of the plurality of light emitting devices, wherein the cathode ring is located in the peripheral area, and the cathode ring surrounds the active area; and a lens layer located at a side of the light emitting devices away from the substrate, wherein the lens layer extends from the active area to the peripheral area; wherein an orthographic projection of the lens layer on the substrate is located within an area delineated by an outer contour of an orthographic projection of the cathode ring on the substrate. Due to the unevenness of surfaces of the lens layer, in the subsequent process for bonding the cover plate, by setting the orthographic projection of the lens layer on the substrate to be located within the area delineated by the outer contour of the orthographic projection of the cathode ring on the substrate, a contact area between the bonding material and the lens layer can be reduced, and a contact area between the bonding material and the flat area can be increased, thereby improving adhesion and bonding stability, and improve the quality of the display panel and extend their service life.

The exemplary embodiments will now be described more comprehensively with reference to the accompanying drawings.

The embodiment of the present application provides a display panel, FIG. 1 to FIG. 5 are plane schematic diagrams of five types of display panels according to embodiments of the present application; FIG. 6 is a partial schematic diagram of a cross-section along a M1M2 direction in FIG. 5 according to an embodiment of the present application; FIG. 7 to FIG. 12 and FIG. 15 are plane schematic diagrams of another seven types of display panels according to embodiments of the present application; FIG. 13 is another cross-section schematic diagram along the M1M2 direction in FIG. 5 according to an embodiment of the present application; FIG. 14 is yet another cross-section schematic diagram along the M1M2 direction in FIG. 5 according to an embodiment of the present application. It should be noted that, FIG. 1 to FIG. 5, FIG. 7 to FIG. 12, and FIG. 15 all highlight the plane distribution of some structures in the peripheral area BB of the display panel, without presenting a complete plan view of the display panel. FIG. 6, FIG. 13, and FIG. 14 do not show the complete layer structure of the display panel, and the layer structure that is not shown can be seen in the related art.

As shown in FIG. 1 to FIG. 5, the display panel includes the active area AA and the peripheral area (not marked), and the peripheral area surrounds the active area AA.

As shown in FIG. 6, FIG. 13 or FIG. 14, the display panel further includes: the substrate 1 and the plurality of light emitting devices Q arranged on the substrate 1 in array, wherein the plurality of light emitting devices Q are located at least in the active area AA; the conducting layer 3 including the cathode ring 31 and cathodes of the plurality of light emitting devices Q, wherein the cathode ring 31 is located in the peripheral area BB, and the cathode ring 31 surrounds the active area AA; and the lens layer 2 located at the side of the light emitting devices Q away from the substrate 1, wherein the lens layer 2 extends from the active area AA to the peripheral area BB; wherein the orthographic projection of the lens layer 2 on the substrate 1 is located within the area delineated by the outer contour of the orthographic projection of the cathode ring 31 on the substrate 1.

It should be noted that, FIG. 6, FIG. 13 or FIG. 14 only illustrate a left side of the cross-sectional view. Combined with the plan view shown in FIG. 1 to FIG. 5, it can be seen that the area delineated by the outer contour of the orthographic projection of the cathode ring 31 on the substrate 1 is an enclosed area.

In FIG. 6, FIG. 13 or FIG. 14, the display panel includes the substrate 1 and a plurality of sub pixels located on the substrate 1, the plurality of sub pixels includes the light emitting device Q and a color conversion layer, and the color conversion layer is located on a light emitting side of the light emitting device Q. Each light emitting device Q includes a luminescent functional layer 10, and a first electrode and a second electrode that are located on both sides of the luminescent functional layer 10. Among them, one of the first electrode and the second electrode is an anode, and the other is a cathode. In the case where the first electrode is the anode and the second electrode is the cathode, the first electrode is located between the luminescent functional layer 10 and the substrate 1, and at least a portion of the second electrode is located at a side of the luminescent functional layer 10 away from the first electrode; that is to say, the first electrode and the second electrode are located on both sides in the direction perpendicular to the luminescent functional layer 10. The luminescent functional layer 10 does not only include a film layer that directly emits light, but also includes a functional film layer used for auxiliary luminescence, such as a hole transport layer, an electron transport layer, and so on.

It should be noted that, in the drawings provided in the embodiment of the present application, for simplicity, the luminescent functional layers 10 of the light emitting devices Q are drawn together. In practical applications, when the emitting colors of the light emitting devices Q are the same, the luminescent functional layers 10 of the light emitting devices Q can be connected together. When the emitting colors of the light emitting devices Q are not exactly the same, the luminescent function layers 10 of the light emitting devices Q can be separated, for example, separating them through pixel definition layers (not shown in FIG. 6) to avoid color crosstalk of the sub pixels.

In the case where the first electrode is the anode and the second electrode is the cathode, the plurality of light emitting devices Q can share the second electrode. For example, the cathode may be formed from materials with high conductivity and low work function, for example, the cathode may be made of metal materials. For example, the anode may be formed from transparent conductive materials with high work functions.

In some examples, the material of the substrate 1 may include one or more of glass, polyimide, polycarbonate, polyacrylate, polyetherimide, and polyether sulfone. This embodiment includes but is not limited to this.

In some examples, the substrate 1 may be a rigid substrate or a flexible substrate. When the substrate 1 is the flexible substrate, the substrate 1 may include a single layer of flexible material layer. Alternatively, the substrate 1 may include a first flexible material layer, a first inorganic non-metallic material layer, a second flexible material layer, and a second inorganic non-metallic material layer arranged in sequence. The first flexible material layer and the second flexible material layer are made of polyimide (PI), polyethylene terephthalate (PET), polymer soft film with surface treatment or other materials. The first inorganic non-metallic material layer and the second inorganic non-metallic material layer are made of materials such as silicon nitride (SiNx) or silicon oxide (SiOx), to improve a water oxygen resistance of the substrate. The first inorganic non-metallic material layer and the second inorganic non-metallic material layer are also known as barrier layers.

When the substrate 1 is the rigid substrate, the substrate 1 may be a glass substrate or a silicon material substrate. When the substrate 1 is the silicon material substrate, a plurality of conductive material layers and a plurality of insulating material layers may be set between the substrate 1 and the light emitting device Q to form a driving circuit and a pixel circuit. Among them, the substrate 1, as well as the driving circuit and the pixel circuit located on the substrate 1, can be collectively referred to as a driving backplane. The driving backplane may be a field-effect transistor driving backplane (MOS driving backplane), where metal layers in the MOS driving backplane are separated by insulation layers (such as a first insulation layer 8 and a second insulation layer 9) and electrically connected through tungsten holes (W Via).

Among them, the silicon material substrate may be a P-type monocrystal silicon substrate, or it may also be a N-type monocrystal silicon substrate, which may be determined based on the actual product. It should be noted that, the embodiment of the present application takes the above display panel being a display panel with the silicon material substrate as an example.

In some examples, other film layers may also be set between the substrate 1 and the light emitting device Q, which may include a gate insulation layer, an interlayer insulation layer, various film layers in the pixel circuit (for example, including structures such as thin film transistors and storage capacitors), data lines, gate lines, power signal lines, reset power signal lines, reset control signal lines, luminescence control signal lines, and the like.

In some examples, the plurality of light emitting devices Q are located at least in the active area AA, including but not limited to the following situations:

firstly, the light emitting devices Q are located in the active area AA;

secondly, as shown in FIG. 6, FIG. 13, or FIG. 14, the light emitting devices Q are not only located in the active area AA, but also extends from the active area AA to a dummy area in the peripheral area BB.

It should be noted that, the light emitting devices Q located in the active area AA can emit light and display, while the light emitting devices Q located in the dummy area in the peripheral area BB cannot emit light or display. Among them, the light emitting device Q located in the dummy area of the peripheral area BB is used to improve the structural consistency of the active area AA and the peripheral area BB of the display panel, which avoids visible color differences in a junction area between the active area AA and the peripheral area BB due to significant structural differences in the dark state of the display panel, and results in a natural transition between the active area AA and the peripheral area BB. Thus, improving the aesthetics of the display panel.

As shown in FIG. 6, FIG. 13, or FIG. 14, the luminescent functional layer 10 and the anode of the light emitting device Q located in the active area AA are conductive, while the luminescent functional layer 10 and the anode of the light emitting device Q located in the dummy area of the peripheral area BB are provided with an insulating material therebetween, which cannot be conductive. For example, the anode of the light emitting device Q located in the dummy area of the peripheral area BB is covered with the insulating material, which envelops a side of the anode and a surface of the anode away from the substrate 1, thus making it unable to conduct with other conductive film layers.

In some embodiments, the insulating material here may be prepared using the same material as a pixel definition layer. By way of example, the material of the pixel definition layer may include an organic material, such as polyimide, acrylic or polyethylene terephthalate. The specific setting position and structure of the pixel definition layer can refer to related art, and will not be repeated here.

There is no restriction on a planar graph of the above active area AA. Exemplary, the planar graph of the active area AA may be the rectangle shown in the drawings of the embodiment of the present application. Alternatively, the planar graph of the active area AA can also be other polygons, such as pentagon, hexagon, etc., which are determined according to the use scenario and use requirements. As an example, the planar graph of the peripheral area BB can be circular. With the planar graph of the active area AA being different, the planar graph of the peripheral area BB also varies. The planar graph of the peripheral area BB may be determined based on the planar graph of the active area AA. The above planar graph refer to a graph of an orthographic projection of the display panel on the substrate.

In some embodiments, the emitting colors of the light emitting devices Q in the active area AA of the display panel are the same, for example, the emitting colors of the light emitting devices Q are blue. Alternatively, the emitting colors of the light emitting devices Q are white. When the emitting colors of the light emitting devices Q are blue, the color conversion layer may include a first color conversion pattern, a second color conversion pattern, and a third color pattern. Among them, the blue light emitted by the light emitting devices Q can emit red light after passing through the first color conversion pattern, the blue light emitted by the light emitting devices Q can emit green light after passing through the second color conversion pattern, and the blue light emitted by the light emitting devices Q can emit blue light after passing through the third color pattern. Among them, the first color conversion pattern can be a red quantum dot pattern, the second color conversion pattern can be a green quantum dot pattern, and the third color pattern can be a transparent pattern.

In some embodiments, each light emitting device Q in the active area AA of the display panel includes a first-color light emitting device, a second-color light emitting device, and a third-color light emitting device. The first-color light emitting device, the second-color light emitting device, and the third-color light emitting device are arranged in an array according to a certain rule, where the light emitted by the first-color light emitting device is red, the light emitted by the second-color light emitting device is green, and the light emitted by the third-color light emitting device is blue. At this point, the color conversion layer may include a first filter pattern, a second filter pattern, and a third filter pattern. The first filter pattern may be a red color blocking pattern, the second filter pattern may be a green color blocking pattern, and the third filter pattern may be a blue color blocking pattern. This color conversion layer can also be referred to as a color film layer or a color filter layer (CF). Among them, an orthographic projection of the first filter pattern on the substrate 1 overlaps with an orthographic projection of the first-color light emitting device on the substrate 1, an orthographic projection of the second filter pattern on the substrate 1 overlaps with an orthographic projection of the second-color light emitting device on the substrate 1, and an orthographic projection of the third filter pattern on the substrate 1 overlaps with an orthographic projection of the third-color light emitting device on the substrate 1.

As shown in FIG. 6, FIG. 13, or FIG. 14, the display panel includes the conducting layer 3 which includes the cathode ring 31 and the cathodes of the light emitting devices Q. For example, the cathode ring 31 and the cathodes of the light emitting devices Q can be an integrated structure, the integrated structure refers to that the cathode ring 31 and the cathodes of the light emitting devices Q are connected, and can be prepared using the same material in a single composition process.

In the display panel provided in the embodiment of the present application, the cathode ring 31 is electrically connected to the cathodes of the light emitting devices Q, and the area where the cathode ring 31 is located is marked as a R area. Among them, each anode located in the R area where the cathode ring 31 is located is connected to the cathode ring 31 to form a closed-loop circuit between the light emitting devices Q and the drive circuit of the display panel. In order to distinguish the anodes of the light emitting devices Q and the anodes located in the R area where the cathode ring 31 is located, each anode located in the R area where the cathode ring 31 is located are also referred to as a positive electrode 7. The positive electrode 7 can be conductive with the anode of each light emitting device Q.

As an example, the above conducting layer 3 may be formed from materials with high conductivity and low work function. For example, the conducting layer 3 may be made of metal materials.

In some examples, the conducting layer 3 can use any one or more of metal materials such as magnesium (Mg), silver (Ag), copper (Cu), aluminum (Al), titanium (Ti), and molybdenum (Mo), or alloy materials of the above metals, such as aluminum neodymium alloy (AlNd) or molybdenum niobium alloy (MoNb), which may be a single-layer structure or a multi-layer structure, such as Ti/Al/Ti, or a stacked structure formed by the metal and transparent conductive materials, such as ITO/Ag/ITO, Mo/AlNd/ITO, and so on.

The above lens layer 2 includes a plurality of lens structures, and the lens layer 2 is at least located at s side of each light emitting device Q away from the substrate 1, that is, the lens layer 2 is at least located at the light emitting side of each light emitting device Q, to adjust the light path of the display light emitted by the light emitting device Q and improve the light emitting efficiency.

Figure 2:
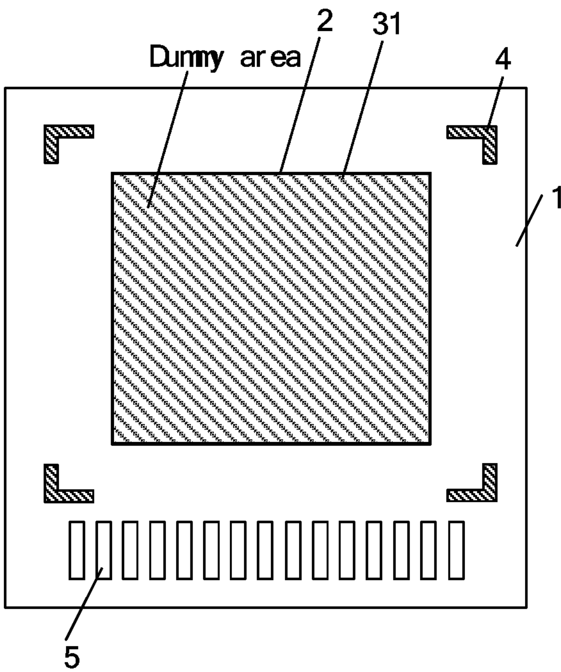
Figure 3:
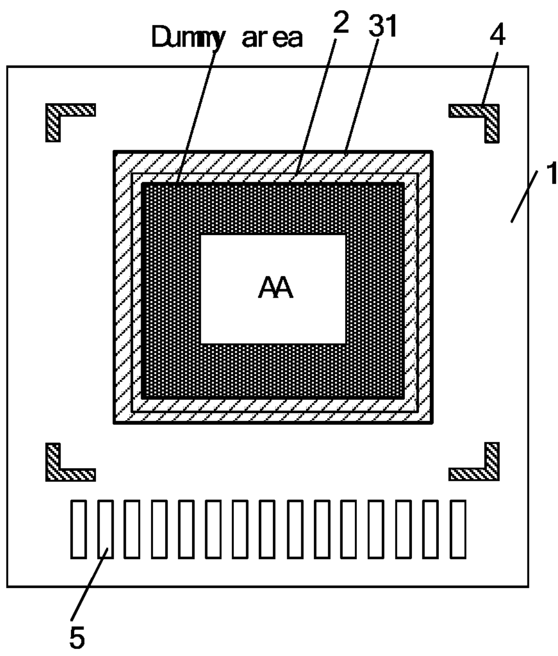
Figure 4:
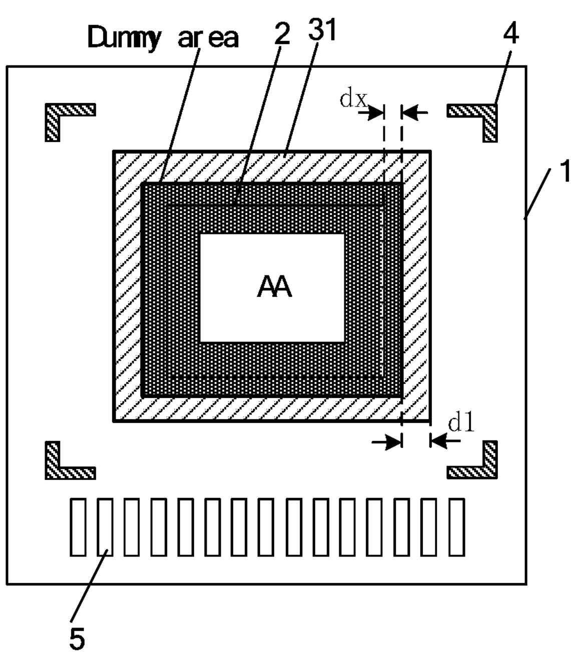
Figure 5:
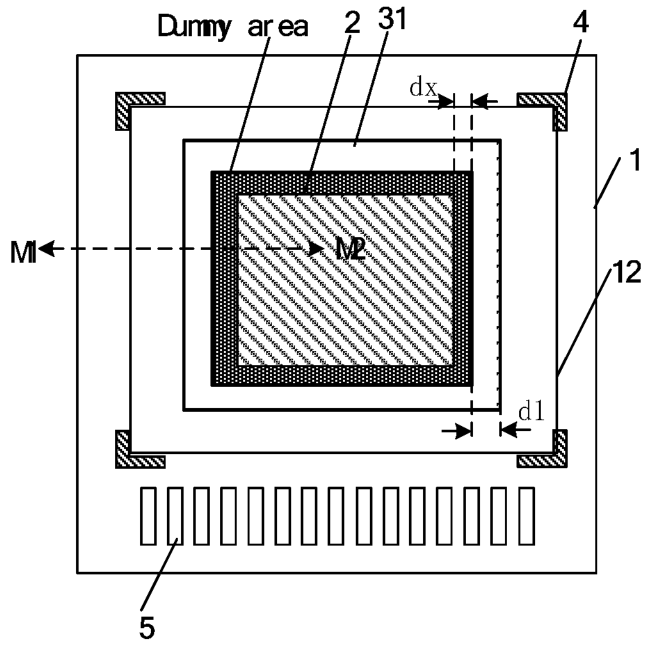
Figure 6:
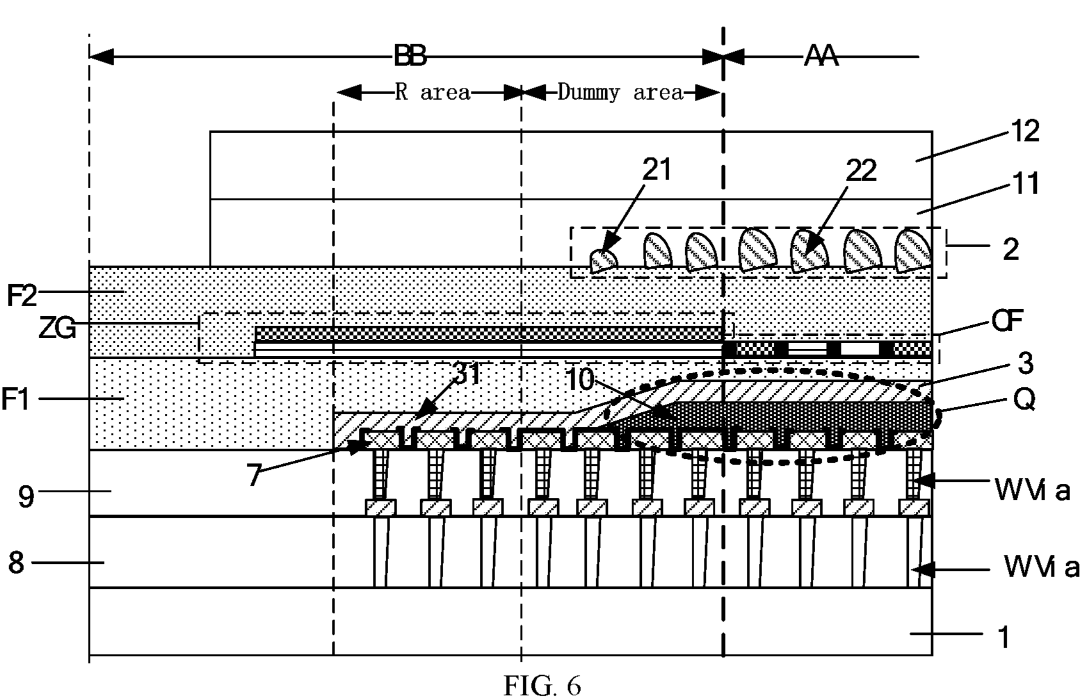
FIG. 6 is a partial schematic diagram of a cross-section along a M1M2 direction in FIG. according to an embodiment of the present application.

In an exemplary embodiment, the orthographic projection of the lens layer 2 on the substrate 1 is located within the area delineated by the outer contour of the orthographic projection of the cathode ring 31 on the substrate 1, including but not limited to the following situations:

firstly, as shown in FIG. 2, the outer contour of the orthographic projection of the lens layer 2 on the substrate 1 overlaps with the outer contour of the orthographic projection of the cathode ring 31 on the substrate 1;

secondly, as shown in FIG. 3, FIG. 4, and FIG. 5, the outer contour of the orthographic projection of the lens layer 2 on the substrate 1 is located within the area delineated by the outer contour of the orthographic projection of the cathode ring 31 on the substrate 1. Among them, the outer contour of the orthographic projection of the lens layer 2 on the substrate 1 is located within the area delineated by the outer contour of the orthographic projection of the cathode ring 31 on the substrate 1, which may include the following situations:

1) as shown in FIG. 3, FIG. 4, and FIG. 5, the orthographic projection of the lens layer 2 on the substrate 1 is located within the area delineated by the inner contour of the orthographic projection of the cathode ring 31 on the substrate 1, and the outer contour of the orthographic projection of the lens layer 2 on the substrate 1 is located in the peripheral area BB;
2) the orthographic projection of the lens layer 2 on the substrate 1 is located within the area delineated by the inner contour of the orthographic projection of the cathode ring 31 on the substrate 1, and the outer contour of the orthographic projection of the lens layer 2 on the substrate 1 is located at the junction of the active area AA and the peripheral area BB;
3) the orthographic projection of the lens layer 2 on the substrate 1 is located within the area delineated by the inner contour of the orthographic projection of the cathode ring 31 on the substrate 1, and the outer contour of the orthographic projection of the lens layer 2 on the substrate 1 is located in the active area AA. In practical applications, as the lens layer 2 is used to improve the light emitting effect, in order to maximize the light efficiency of the display panel and avoid some light emitting devices Q without setting the lens layer 2 at the light emitting side, in rare cases, the outer contour of the orthographic projection of the lens layer 2 on the substrate 1 is arranged in the active area AA.

The orthographic projection of the lens layer 2 on the substrate 1 refers to the projection of the lens layer 2 on the substrate 1 in the direction perpendicular to the plane where the substrate 1 is located. The description of "orthographic projection" in the embodiment of the present application is similar to the meaning here, and will not be repeated in the following text.

In some embodiments, the material of the lens layer 2 may include an organic material, such as resins. In practical applications, the lens layer 2 of the organic material may be prepared through a high-temperature hot melting process.

In some other embodiments, the material of the lens layer 2 may include one of silicon nitride, silicon oxide, and silicon oxynitride. In practical applications, the lens layer of the organic material may be prepared through the high-temperature hot melting process, and then an inorganic material layer may be formed on the lens layer of the organic material. The lens layer of the organic material may be etched off through a dry etching process to obtain the lens layer 2 of the inorganic material.

In addition, a refractive index of the material of the lens layer 2 is greater than that of the material of the film layer that is located on the light emitting side of the lens layer 2 and in direct contact with the lens layer 2.

There is no restriction on a contour shape of an upper surface of the lens layer 2 along a section perpendicular to the plane where the substrate 1 is located. The upper surface of the lens layer 2 refers to a surface where light is emitted from the lens layer 2. The upper surface of the lens layer 2 is a line along the section perpendicular to the plane where the substrate 1 is located. In some embodiments, the contour shape of the upper surface of the lens layer 2 along the section perpendicular to the plane where the substrate 1 is located is a broken line shape. In some embodiments, the contour shape of the upper surface of the lens layer 2 along the section perpendicular to the plane where the substrate 1 is located is a curved shape. In some embodiments, the contour shape of the upper surface of the lens layer 2 along the section perpendicular to the plane where the substrate 1 is located is a combination of the broken line shape and the curved shape.

In the display panel provided by the embodiment of the present application, by setting the orthographic projection of the lens layer 2 on the substrate 1 to be located within the area delineated by the outer contour of the orthographic projection of the cathode ring 31 on the substrate 1, the contact area between the bonding material and the lens layer 2 can be reduced in the subsequent process for bonding a cover plate 12 due to the unevenness of the surface of the lens layer 2, which may increase the contact area between the bonding material and the flat area, thereby improving adhesion and bonding stability, improving the quality of the display panel, and extending its service life.

In the display panel provided by the embodiment of the present application, as shown in FIG. 1, the outer contour of the orthographic projection of the lens layer 2 on the substrate 1 overlaps with the inner contour of the orthographic projection of the cathode ring 31 on the substrate 1.

It should be noted that the inner contour of the cathode ring 31 overlaps with the outer contour of the cathode of each light emitting device Q, and the outer contour of the cathode ring 31 is the outer contour of the conducting layer 3.

In the display panel provided by the embodiment of the present application, as shown in FIG. 4 or FIG. 5, there is a gap between the outer contour of the orthographic projection of the lens layer 2 on the substrate 1 and the inner contour of the orthographic projection of the cathode ring 31 on the substrate 1, and the outer contour of the orthographic projection of the lens layer 2 on the substrate 1 falls into the peripheral area BB.

The gap between the outer contour of the orthographic projection of the lens layer 2 on the substrate 1 and the inner contour of the orthographic projection of the cathode ring 31 on the substrate 1 means: referring to FIG. 4, FIG. 5 and FIG. 6, the orthographic projection of the lens layer 2 on the substrate 1 does not overlap with the orthographic projection of the cathode ring 31 on the substrate 1, the outer contour of the orthographic projection of the lens layer 2 on the substrate 1 is located within the inner contour of the orthographic projection of the cathode ring 31 on the substrate 1, and there is a certain distance between the outer contour of the orthographic projection of the lens layer 2 on the substrate 1 and the inner contour of the orthographic projection of the cathode ring 31 on the substrate 1. In FIG. 4 and FIG. 5, a size of the gap between the outer contour of the orthographic projection of the lens layer 2 on the substrate 1 and the inner contour of the orthographic projection of the cathode ring 31 on the substrate 1 in the direction from the active area AA pointing to the peripheral area BB is labeled dx.

In the embodiment of the present application, by setting the gap between the outer contour of the orthographic projection of the lens layer 2 on the substrate 1 and the inner contour of the orthographic projection of the cathode ring 31 on the substrate 1, and setting that the outer contour of the orthographic projection of the lens layer 2 on the substrate 1 falls into the peripheral area BB, while ensuring that the lens layer 2 can improve the light emitting efficiency of each light emitting device Q in the display panel, in the subsequent process for bonding the cover plate 12, it can further reduce the contact area between the bonding material and the lens layer 2, and increase the contact area between the bonding material and the flat area. Thereby improving the adhesion and the bonding stability, improving the quality of the display panel, and extending the service life of the display panel.

In the display panel provided by the embodiment of the present application, as shown in FIG. 4 and FIG. 5, the size dx of the gap in the direction from the active area AA pointing to the peripheral area BB is less than or equal to a width d1 of the cathode ring 31 in the direction from the active area AA pointing to the peripheral area BB.

In some embodiments, the size dx of the gap in the direction from the active area AA pointing to the peripheral area BB is less than the width d1 of the cathode ring 31 in the direction from the active area AA pointing to the peripheral area BB.

In some embodiments, the size dx of the gap in the direction from the active area AA pointing to the peripheral area BB is equal to the width d1 of the cathode ring 31 in the direction from the active area AA pointing to the peripheral area BB.

In FIG. 4 or FIG. 5, the direction from the active area AA pointing to the peripheral area BB may be a direction from a geometric center of the active area AA pointing to an upper side of the display panel; or, a direction from the geometric center of the active area AA pointing to a lower side of the display panel; or, a direction from the geometric center of the active area AA pointing to a left side of the display panel; or, a direction from the geometric center of the active area AA pointing to a right side of the display panel.

In the display panel provided by the embodiment of the present application, the size dx of the gap in the direction from the active area AA pointing to the peripheral area BB is greater than or equal to a size of one of the plurality of light emitting devices Q in the direction from the active area AA pointing to the peripheral area BB.

In some embodiments, the size dx of the gap in the direction from the active area AA pointing to the peripheral area BB is greater than the size of one of the plurality of light emitting devices Q in the direction from the active area AA pointing to the peripheral area BB.

In some embodiments, the size dx of the gap in the direction from the active area AA pointing to the peripheral area BB is equal to the size of one of the plurality of light emitting devices Q in the direction from the active area AA pointing to the peripheral area BB.

There are no restrictions on the shapes of the graphs of the orthographic projections of the light emitting devices Q on the substrate 1. The following takes the shapes of the graphs of the orthographic projections of the light emitting devices Q on the substrate 1 being a rectangle as an example to illustrate. Based on the different layout directions of the light emitting devices Q in the display panel, the size of the light emitting device Q in the direction from the active area AA pointing to the peripheral area BB may be a size of a long side of the rectangle. Alternatively, the size of the light emitting device Q in the direction from the active area AA pointing to the peripheral area BB may be a size of a short side of the rectangle. Alternatively, the size of the light emitting device Q in the direction from the active area AA pointing to the peripheral area BB may be the diagonal size of the rectangle. When the shapes of the graphs of the orthographic projections of the light emitting devices Q on the substrate 1 are other graphs, the meaning of the size of the light emitting device Q in the direction from the active area AA pointing to the peripheral area BB is similar to the above description. For simplicity, it will not be repeated here.

In the embodiment of the present application, by setting the gap between the outer contour of the orthographic projection of the lens layer 2 on the substrate 1 and the inner contour of the orthographic projection of the cathode ring 31 on the substrate 1, and setting that the outer contour of the orthographic projection of the lens layer 2 on the substrate 1 falls into the peripheral area BB, while ensuring that the lens layer 2 can improve the light emitting efficiency of each light emitting device Q in the display panel, in the subsequent process for bonding the cover plate 12, it can further reduce the contact area between the bonding material and the lens layer 2, and increase the contact area between the bonding material and the flat area. Thereby improving the adhesion and the bonding stability, improving the quality of the display panel, and extending the service life of the display panel.

In the display panel provided by the embodiment of the present application, as shown in FIG. 6, a part of the plurality of light emitting devices Q are located in the peripheral area BB, the light emitting devices Q located in the peripheral area BB are arranged in one circle along the edge of the active area AA, and the orthographic projection of the cathode ring 31 on the substrate 1 is located at a side, away from the active area AA, of an orthographic projection of each light emitting device Q located in the peripheral area BB on the substrate 1; wherein the orthographic projections of the light emitting device Q located in the peripheral area BB on the substrate 1 are located within the orthographic projection of the lens layer 2 on the substrate 1.

Among them, the light emitting devices Q located in the peripheral area BB cannot emit light. For example, the anode of the light emitting device Q located in the dummy area of the peripheral area BB is covered with the insulating material, which envelops the side of the anode and the surface of the anode away from the substrate 1, and makes it unable to conduct with other conductive film layers, therefore, it cannot emit light. The light emitting device Q located in the dummy area of the peripheral area BB is used to improve the structural consistency of the active area AA and the peripheral area BB of the display panel, which avoids visible color differences in the junction area between the active area AA and the peripheral area BB due to significant structural differences in the dark state of the display panel, and results in the natural transition between the active area AA and the peripheral area BB. Thus, improving the aesthetics of the display panel.

The orthographic projection of the cathode ring 31 on the substrate 1 is located at the side, away from the active area AA, of the orthographic projection of each light emitting device Q located in the peripheral area BB on the substrate 1, which may be understood as: an area where the cathode ring 31 is located is outside the dummy area where the light-emitting device Q in the peripheral area BB is located. Among them, the outside refers to the side away from the active area AA and close to the edge of the display panel.

In addition, the orthographic projections of the light emitting devices Q located in the peripheral area BB on the substrate 1 is located within the orthographic projection of the lens layer 2 on the substrate 1, including but not limited to the following situations:

- firstly, as shown in FIG. 6, the outer contour of the orthographic projections of the light emitting devices Q located in the peripheral area BB on the substrate 1 falls into an area delineated by the outer contour of the orthographic projection of the lens layer 2 on the substrate 1;
- secondly, the outer contour of the orthographic projections of the light emitting devices Q located in the peripheral area BB on the substrate 1 overlaps with the outer contour of the orthographic projection of the lens layer 2 on the substrate 1.

In the display panel provided by the embodiment of the present application, by setting that a part of the plurality of light emitting devices Q are located in the peripheral area BB, the light emitting devices Q located in the peripheral area BB are arranged in one circle along the edge of the active area AA, and the orthographic projections of the light emitting devices Q located in the peripheral area BB on the substrate 1 are located within the orthographic projection of the lens layer 2 on the substrate 1, the structural consistency of the active area AA and the peripheral area BB of the display panel may be further improved. Which avoids visible color differences in the junction area between the active area AA and the peripheral area BB due to significant structural differences in the dark state of the display panel, and results in the natural transition between the active area AA and the peripheral area BB. Thus, improving the aesthetics of the display panel.

In the display panel provided by the embodiment of the present application, as shown in FIG. 7 to FIG. 12, the peripheral area BB includes a first peripheral subarea B1, a second peripheral subarea B2, a third peripheral subarea B3 and a fourth peripheral subarea B4, the fourth peripheral subarea B4 is disposed opposite to the first peripheral subarea B1, the second peripheral subarea B2 is disposed opposite to the third peripheral subarea B3, and the fourth peripheral subarea B4 includes a binding terminal 5; and

Figure 7:
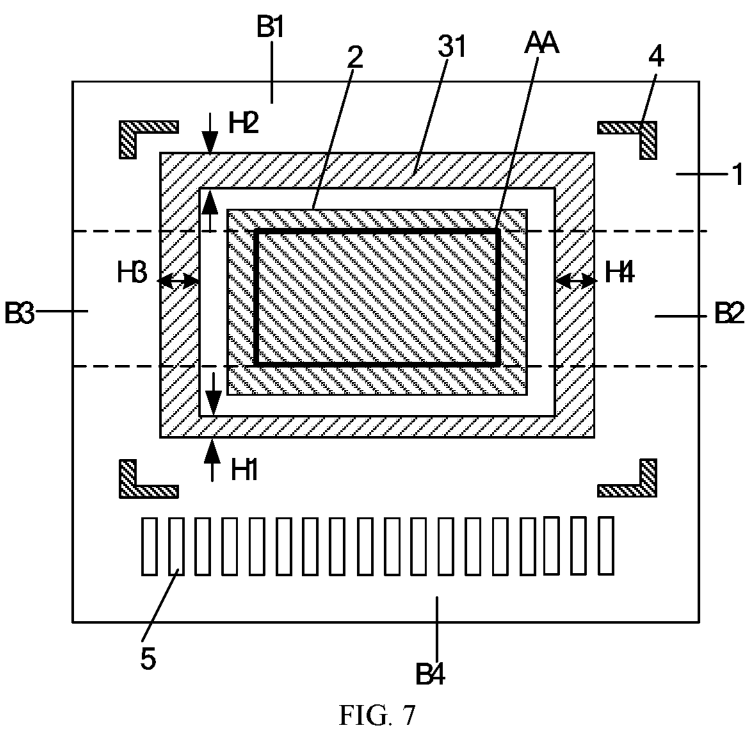
FIG. 7 to FIG. 12 and FIG. 15 are plane schematic diagrams of another seven types of display panels according to embodiments of the present application.
Figure 8:
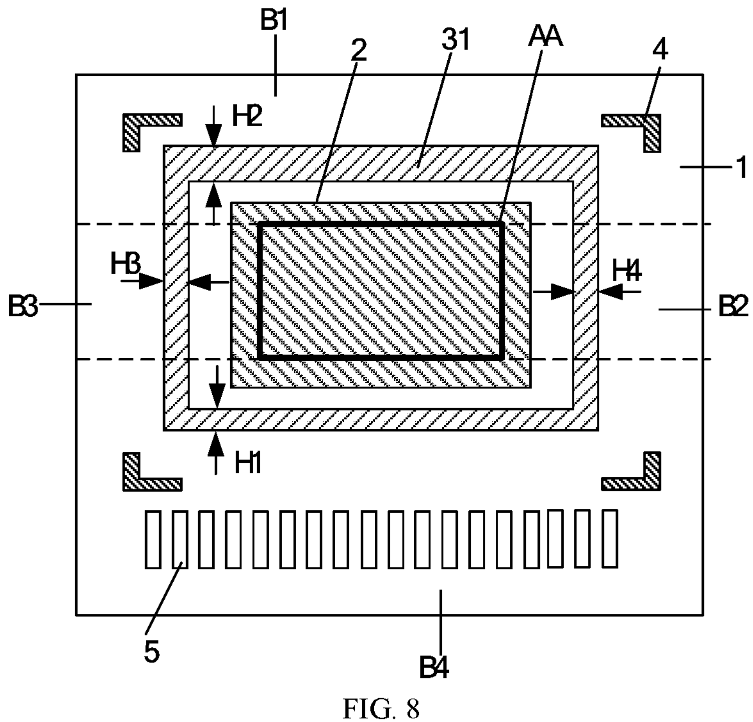

- as shown in FIG. 7 and FIG. 8, a width H1 of a portion of the cathode ring 31 located in the fourth peripheral subarea B4 in the direction from the active area AA pointing to the peripheral area BB is less than or equal to widths (for example, a width H2, a width H3, and a width H4) of a portion of the cathode ring 31 located in the peripheral area BB other than the fourth peripheral subarea B4 in the direction from the active area AA pointing to the peripheral area BB.

In some embodiments, the width H1 of the portion of the cathode ring 31 located in the fourth peripheral subarea B4 in the direction from the active area AA pointing to the peripheral area BB is less than the widths (for example, the width H2, the width H3, and the width H4) of the portion of the cathode ring 31 located in the peripheral area BB other than the fourth peripheral subarea B4 in the direction from the active area AA pointing to the peripheral area BB.

When the width H1 of the portion of the cathode ring 31 located in the fourth peripheral subarea B4 in the direction from the active area AA pointing to the peripheral area BB is less than the widths (for example, the width H2, the width H3, and the width H4) of the portion of the cathode ring 31 located in the peripheral area BB other than the fourth peripheral subarea B4 in the direction from the active area AA pointing to the peripheral area BB, there is no restriction on whether the widths of the portion of the cathode ring 31 located in the peripheral area BB other than the fourth peripheral subarea B4 in the direction from the active area AA pointing to the peripheral area BB are the same. That is to say, there is no restriction on whether the width H2 of a portion of the cathode ring 31 located in the first peripheral subarea B1 in the direction from the active area AA pointing to the peripheral area BB, the width H4 of a portion of the cathode ring 31 located in the second peripheral subarea B2 in the direction from the active area AA pointing to the peripheral area BB, and the width H3 of a portion of the cathode ring 31 located in the third peripheral subarea B3 in the direction from the active area AA pointing to the peripheral area BB are the same.

For example, the width H1 of the portion of the cathode ring 31 located in the fourth peripheral subarea B4 in the direction from the active area AA pointing to the peripheral area BB is less than the width H2 of the portion of the cathode ring 31 located in the first peripheral subarea B1 in the direction from the active area AA pointing to the peripheral area BB, the width H1 of the portion of the cathode ring 31 located in the fourth peripheral subarea B4 in the direction from the active area AA pointing to the peripheral area BB is less than the width H4 of the portion of the cathode ring 31 located in the second peripheral subarea B2 in the direction from the active area AA pointing to the peripheral area BB, and the width H1 of the portion of the cathode ring 31 located in the fourth peripheral subarea B4 in the direction from the active area AA pointing to the peripheral area BB is less than the width H3 of the portion of the cathode ring 31 located in the third peripheral subarea B3 in the direction from the active area AA pointing to the peripheral area BB.

In some embodiments, the width H2 of a portion of the cathode ring 31 located in the first peripheral subarea B1 in the direction from the active area AA pointing to the peripheral area BB, the width H4 of the portion of the cathode ring 31 located in the second peripheral subarea B2 in the direction from the active area AA pointing to the peripheral area BB, and the width H3 of a portion of the cathode ring 31 located in the third peripheral subarea B3 in the direction from the active area AA pointing to the peripheral area BB are all equal.

In some embodiments, the width H2 of a portion of the cathode ring 31 located in the first peripheral subarea B1 in the direction from the active area AA pointing to the peripheral area BB, the width H4 of the portion of the cathode ring 31 located in the second peripheral subarea B2 in the direction from the active area AA pointing to the peripheral area BB, and the width H3 of a portion of the cathode ring 31 located in the third peripheral subarea B3 in the direction from the active area AA pointing to the peripheral area BB are not all equal. Among them, "not all equal" includes that only some of them are equal or the three are all unequal, which will not be repeated here.

In some embodiments, the width H1 of the portion of the cathode ring 31 located in the fourth peripheral subarea B4 in the direction from the active area AA pointing to the peripheral area BB is equal to the widths (for example, the width H2, the width H3, and the width H4) of the portion of the cathode ring 31 located in the peripheral area BB other than the fourth peripheral subarea B4 in the direction from the active area AA pointing to the peripheral area BB.

When the width H1 of the portion of the cathode ring 31 located in the fourth peripheral subarea B4 in the direction from the active area AA pointing to the peripheral area BB is equal to the widths (for example, the width H2, the width H3, and the width H4) of the portion of the cathode ring 31 located in the peripheral area BB other than the fourth peripheral subarea B4 in the direction from the active area AA pointing to the peripheral area BB, the width H2 of a portion of the cathode ring 31 located in the first peripheral subarea B1 in the direction from the active area AA pointing to the peripheral area BB, the width H4 of the portion of the cathode ring 31 located in the second peripheral subarea B2 in the direction from the active area AA pointing to the peripheral area BB, and the width H3 of a portion of the cathode ring 31 located in the third peripheral subarea B3 in the direction from the active area AA pointing to the peripheral area BB are all equal.

Because that the fourth peripheral subarea B4 includes the binding terminal 5, it can be understood that at least one driver chip may be set in a local area of the fourth peripheral subarea B4, and the driver chip is electrically connected to the display panel through the binding terminal 5, to provide a driving signal to the display panel.

As shown in FIG. 7 and FIG. 8, by setting the gap between the outer contour of the orthographic projection of the lens layer 2 on the substrate 1 and the inner contour of the orthographic projection of the cathode ring 31 on the substrate 1, and making the width H1 of the portion of the cathode ring 31 located in the fourth peripheral subarea B4 in the direction from the active area AA pointing to the peripheral area BB to be less than the widths (for example, the width H2, the width H3, and the width H4) of the portion of the cathode ring 31 located in the peripheral area BB other than the fourth peripheral subarea B4 in the direction from the active area AA pointing to the peripheral area BB, the width H1 of the portion of the cathode ring 31 located in the fourth peripheral subarea B4 in the direction from the active area AA pointing to the peripheral area BB is narrow. Therefore, in the fourth peripheral subarea B4, a large bonding space is reserved for the bonding material and the film layers in the flat area, thus improving the bonding area between the bonding material and the lower layer of the film layers, improving the adhesion and the bonding stability, improving the quality of the display panel, and extending the service life of the display panel.

In addition, during the subsequent binding process, when pressure and heating are applied to the local area of the fourth peripheral subarea B4, due to the small area occupied by the cathode ring 31 in the fourth peripheral subarea B4, the bonding material has a relatively large area to adhere with the relatively flat area. Even if the heat in the binding process causes thermal expansion of the bonding material, the bonding area of the bonding material is relatively large, after the superposition of the effects of the two factors, the adhesion between the cover plate 12 and the bonding material does not decrease, which further improves the bonding stability of the cover plate 12, improves the quality of the display panel, and extends the service life of the display panel.

In the display panel provided by the embodiment of the present application, as shown in FIG. 7 or FIG. 8, the width H1 of the portion of the cathode ring 31 located in the fourth peripheral subarea B4 in the direction from the active area AA pointing to the peripheral area BB is less than the width H2 of the portion of the cathode ring 31 located in the first peripheral subarea B1 in the direction from the active area AA pointing to the peripheral area BB.

In the embodiment of the present application, by setting that the width H1 of the portion of the cathode ring 31 located in the fourth peripheral subarea B4 in the direction from the active area AA pointing to the peripheral area BB is less than the width H2 of the portion of the cathode ring 31 located in the first peripheral subarea B1 in the direction from the active area AA pointing to the peripheral area BB, the width H1 of the portion of the cathode ring 31 located in the fourth peripheral subarea B4 in the direction from the active area AA pointing to the peripheral area BB is narrow. Therefore, in the fourth peripheral subarea B4, a large bonding space is reserved for the bonding material and the film layers in the flat area, thus improving the bonding area between the bonding material and the lower layer of the film layers, improving the adhesion and the bonding stability, improving the quality of the display panel, and extending the service life of the display panel. In addition, during the subsequent binding process, when pressure and heating are applied to the local area of the fourth peripheral subarea B4, due to the small area occupied by the cathode ring 31 in the fourth peripheral subarea B4, the bonding material has a relatively large area to adhere with the relatively flat area. Even if the heat in the binding process causes thermal expansion of the bonding material, the bonding area of the bonding material is relatively large, after the superposition of the effects of the two factors, the adhesion between the cover plate 12 and the bonding material does not decrease, which further improves the bonding stability of the cover plate 12, improves the quality of the display panel, and extends the service life of the display panel.

Figure 9:
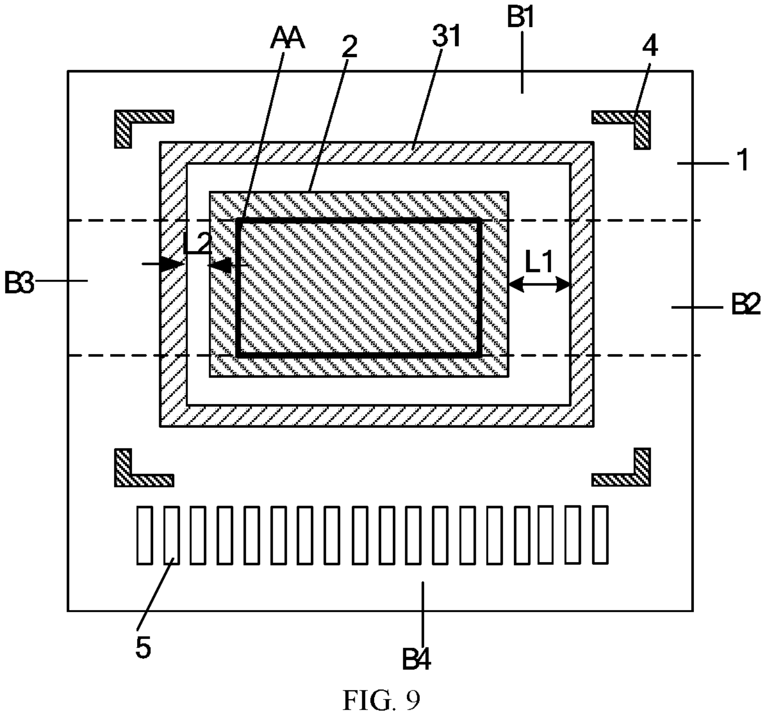
Figure 10:
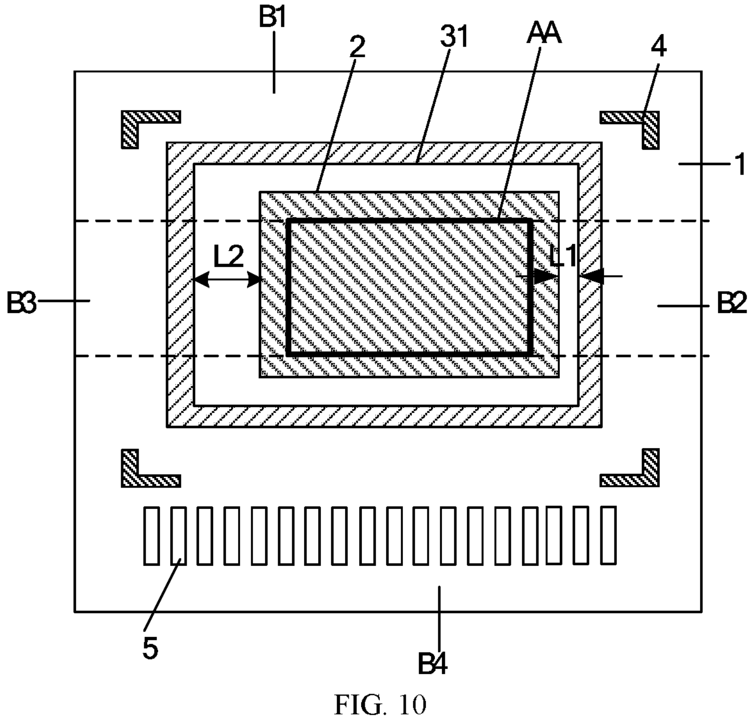

In the display panel provided by the embodiment of the present application, as shown in FIG. 9 and FIG. 10, the graph of the orthographic projection of the lens layer 2 on the substrate 1 includes a first side and a second side that are opposite to each other, an inner contour of a graph of the orthographic projection of the cathode ring 31 on the substrate 1 includes a first edge and a second edge that are opposite to each other, the first side and the first edge are located in the second peripheral subarea B2, and the second side and the second edge are located in the third peripheral subarea B3; and a minimum distance L1 between the first side and the first edge is different from a minimum distance L2 between the second side and the second edge.

It should be noted that the minimum distance L1 between the first side and the first edge refers to a distance from the first side to the first edge in the direction from the active area AA pointing to the peripheral area BB, and the meaning of the minimum distance L2 between the second side and the second edge is similar to this meaning, for simplicity, it will not be repeated here.

In some embodiments, as shown in FIG. 9, the minimum distance L1 between the first side and the first edge is greater than the minimum distance L2 between the second side and the second edge.

In some embodiments, as shown in FIG. 10, the minimum distance L1 between the first side and the first edge is less than the minimum distance L2 between the second side and the second edge.

In the display panel provided by the embodiment of the present application, by setting that the minimum distance L1 between the first side of the lens layer 2 and the first edge of the cathode ring 31 is different from the minimum distance L2 between the second side of the lens layer 2 and the second edge of the cathode ring 31, the second peripheral subarea B2 and the third peripheral subarea B3 located on both sides of the active area AA in the display panel are asymmetric, and the part of the lens layer 2 located in the second peripheral subarea B2 is asymmetric with the part of the lens layer 2 located in the third peripheral subarea B3. Therefore, the display panel can meet the usage needs of the AR or VR display device for the perspective when applied to the AR or VR display device, which enables the display panel to be more widely used in the AR or VR display devices.

Figure 11:
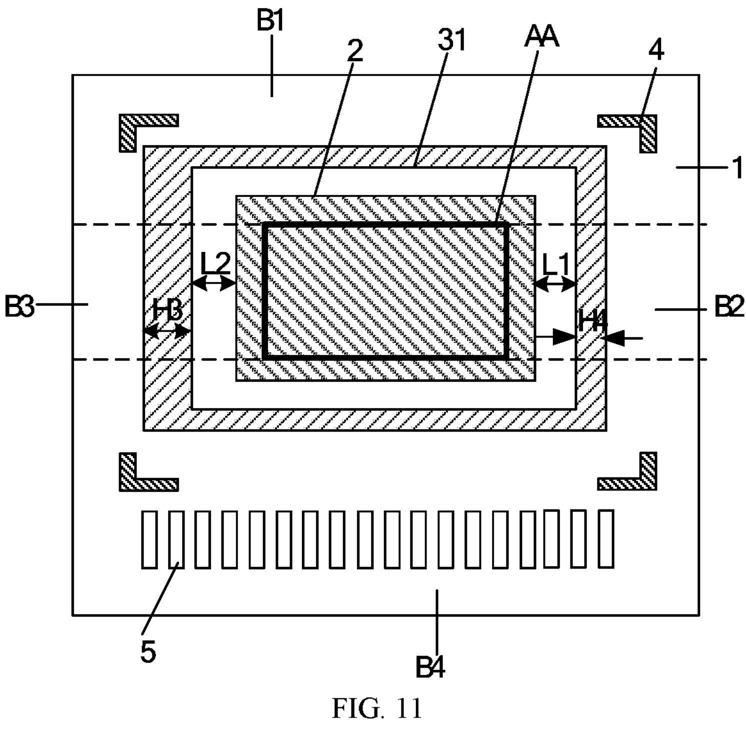
Figure 12:
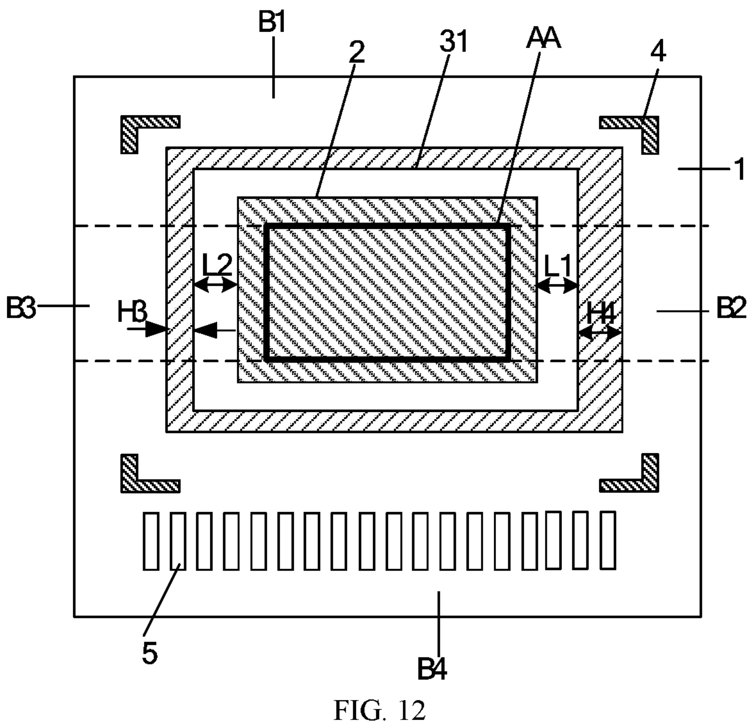
Figures 13, 14:
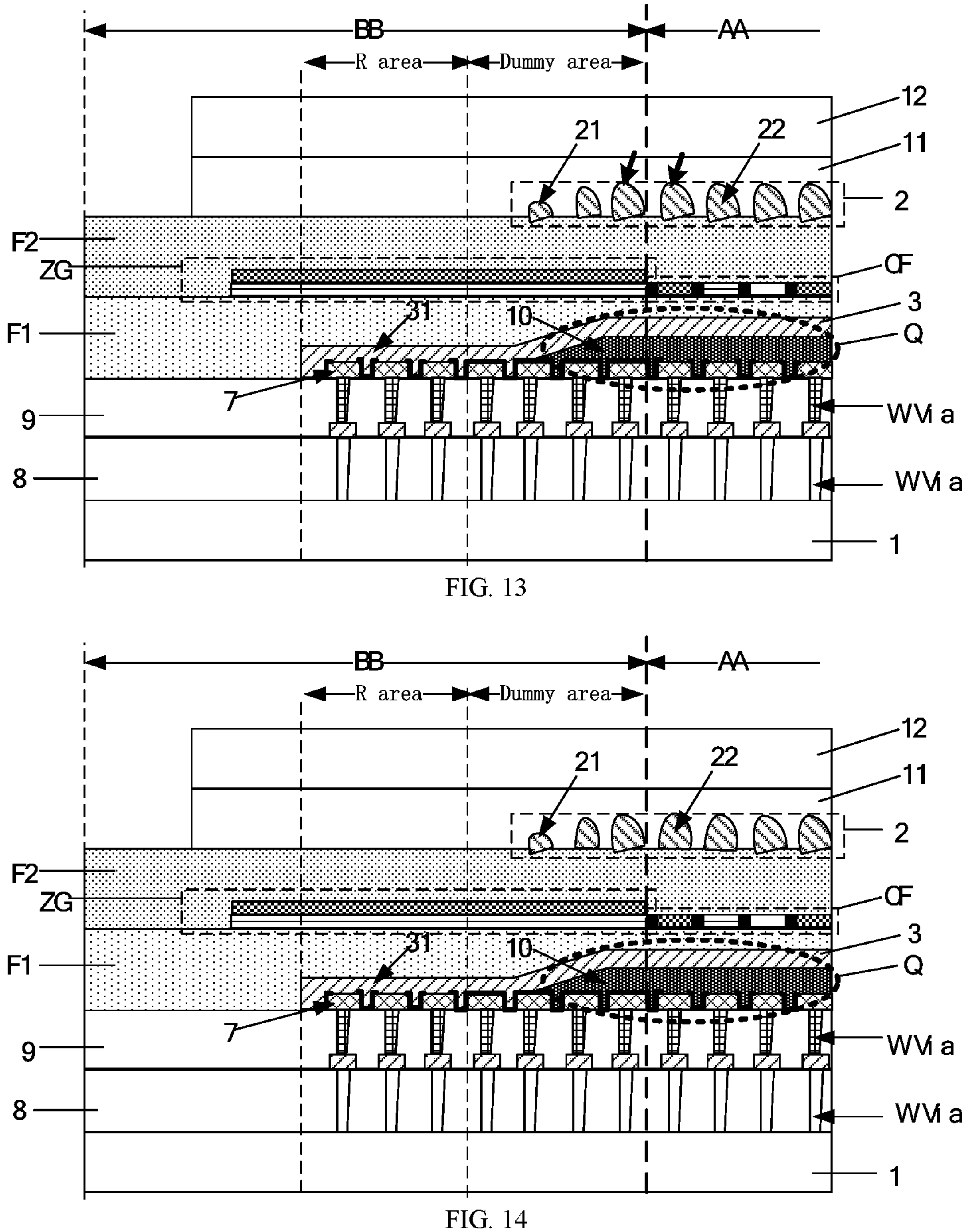
FIG. 13 is another cross-section schematic diagram along the M1M2 direction in FIG. 5 according to an embodiment of the present application.
FIG. 14 is yet another cross-section schematic diagram along the M1M2 direction in FIG. 5 according to an embodiment of the present application.

In the display panel provided by the embodiment of the present application, as shown in FIG. 11 and FIG. 12, the graph of the orthographic projection of the lens layer 2 on the substrate 1 includes the first side and the second side that are opposite to each other, the inner contour of the graph of the orthographic projection of the cathode ring 31 on the substrate includes the first edge and the second edge that are opposite to each other, the first side and the first edge are located in the second peripheral subarea B2, and the second side and the second edge are located in the third peripheral subarea B3; and as shown in FIG. 11 and FIG. 12, the minimum distance L1 between the first side and the first edge is the same as the minimum distance L2 between the second side and the second edge. The width H4 of the portion of the cathode ring 31 located in the second peripheral subarea B2 in the direction from the active area AA pointing to the peripheral area BB is different from the width H3 of the portion of the cathode ring 31 located in the third peripheral subarea B3 in the direction from the active area AA pointing to the peripheral area BB.

In some embodiments, as shown in FIG. 11, the width H4 of the portion of the cathode ring 31 located in the second peripheral subarea B2 in the direction from the active area AA pointing to the peripheral area BB is less than the width H3 of the portion of the cathode ring 31 located in the third peripheral subarea B3 in the same direction.

In some other embodiments, as shown in FIG. 12, the width H4 of the portion of the cathode ring 31 located in the second peripheral subarea B2 in the direction from the active area AA pointing to the peripheral area BB is greater than the width H3 of the portion of the cathode ring 31 located in the third peripheral subarea B3 in the same direction.

In the display panel provided by the embodiment of the present application, by setting that the width H4 of the portion of the cathode ring 31 located in the second peripheral subarea B2 in the direction from the active area AA pointing to the peripheral area BB is different from the width H3 of the portion of the cathode ring 31 located in the third peripheral subarea B3 in the direction from the active area AA pointing to the peripheral area BB, the second peripheral subarea B2 and the third peripheral subarea B3 located on both sides of the active area AA in the display panel are asymmetric. Therefore, the display panel can meet the usage needs of the AR or VR display device for the perspective when applied to the AR or VR display device, which enables the display panel to be more widely used in the AR or VR display devices.

Figures 15, 16:
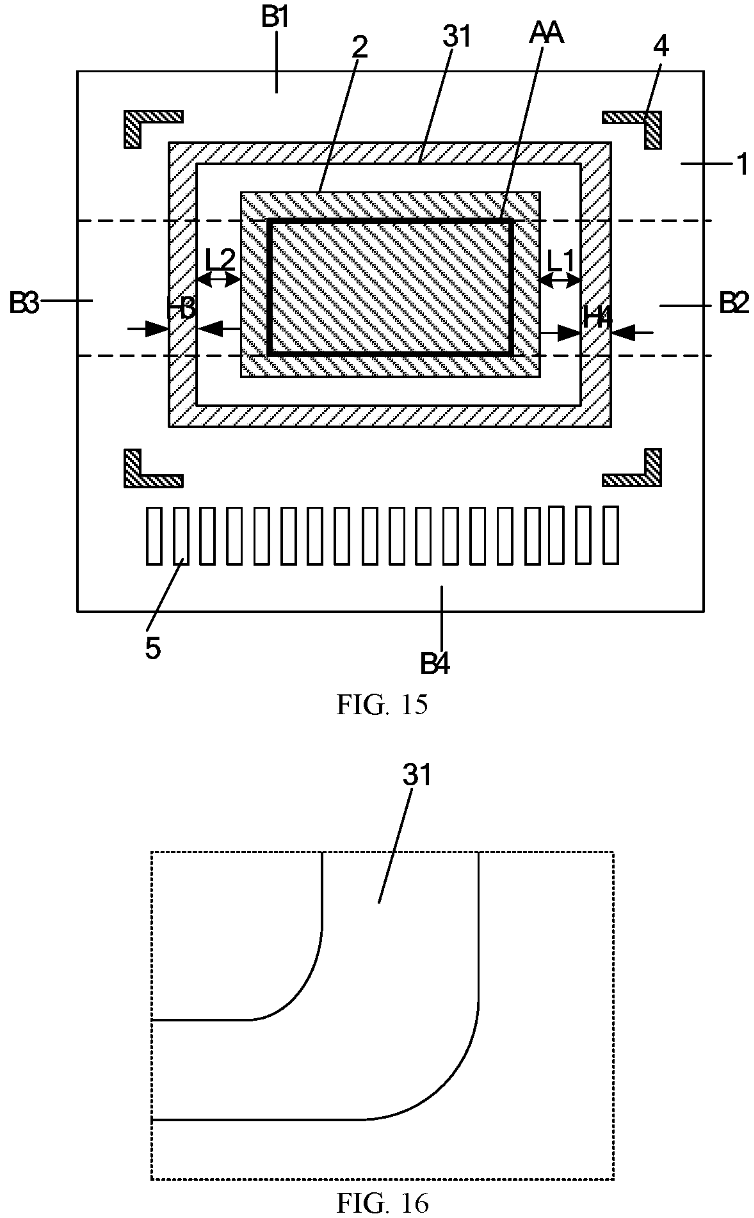
FIG. 16 is a schematic diagram of a partial structure of a cathode ring according to an embodiment of the present application.

In the display panel provided by the embodiment of the present application, as shown in FIG. 15, the graph of the orthographic projection of the lens layer 2 on the substrate 1 includes the first side and the second side that are opposite to each other, the inner contour of the graph of the orthographic projection of the cathode ring 31 on the substrate includes the first edge and the second edge that are opposite to each other, the first side and the first edge are located in the second peripheral subarea B2, and the second side and the second edge are located in the third peripheral subarea B3; the minimum distance L1 between the first side and the first edge is the same as the minimum distance L2 between the second side and the second edge; and the width H4 of the portion of the cathode ring 31 located in the second peripheral subarea B2 in the direction from the active area AA pointing to the peripheral area BB is the same as the width H3 of the portion of the cathode ring 31 located in the third peripheral subarea B3 in the same direction.

In the display panel provided by the embodiment of the present application, by setting that the minimum distance L1 between the first side and the first edge is the same as the minimum distance L2 between the second side and the second edge, and the width H4 of the portion of the cathode ring 31 located in the second peripheral subarea B2 in the direction from the active area AA pointing to the peripheral area BB is the same as the width H3 of the portion of the cathode ring 31 located in the third peripheral subarea B3 in the same direction, it may simplify the design, reduce the difficulty of the preparation process and reduce the cost.

In the display panel provided by the embodiment of the present application, as shown in FIG. 6, FIG. 13 and FIG. 14, the lens layer 2 includes a plurality of first lenses 22 and a plurality of second lenses 21, the plurality of first lenses 22 are located in the active area AA, and the plurality of second lenses 21 are located in the peripheral area BB; and a height of each of the plurality of second lenses 21 in a direction perpendicular to a plane where the substrate 1 is located is less than or equal to a height of each of the plurality of first lenses 22 in the direction perpendicular to the plane where the substrate 1 is located.

In some embodiments, it may set that the height of each of the plurality of second lenses 21 in the direction perpendicular to the plane where the substrate 1 is located is equal to the height of each of the plurality of first lenses 22 in the direction perpendicular to the plane where the substrate 1 is located.

In some other embodiments, it may set that the height of each of the plurality of second lenses 21 in the direction perpendicular to the plane where the substrate 1 is located is less than the height of each of the plurality of first lenses 22 in the direction perpendicular to the plane where the substrate 1 is located.

In the display panel provided by the embodiment of the present application, by setting that the height of each of the plurality of first lenses 22 located in the active area AA is greater than or equal to the height of each of the plurality of second lenses 21 located in the peripheral area BB, while the first lens 22 is capable of converging the display light emitted from the active area AA and improving the light emitting efficiency, the second lens 21 may also serve as a transitional structure. On the one hand, the second lens 21 close to the junction of the active area AA and the peripheral area BB can concentrate light to some extent, which avoids uneven brightness in the local area of the active area AA close to the peripheral area BB. On the other hand, the structural consistency of the active area AA and the peripheral area BB of the display panel may be further improved, which avoids the visible color differences in the junction area between the active area AA and the peripheral area BB due to the significant structural differences in the dark state of the display panel, and results in the natural transition between the active area AA and the peripheral area BB. Thus, improving the aesthetics of the display panel.

In the display panel provided by the embodiment of the present application, as shown in FIG. 6, FIG. 13 and FIG. 14, in the direction from the active area AA pointing to the peripheral area BB, heights of the plurality of second lenses 21 gradually decrease in the direction perpendicular to the plane where the substrate 1 is located.

In the display panel provided by the embodiment of the present application, by setting that in the direction from the active area AA pointing to the peripheral area BB, heights of the plurality of second lenses 21 gradually decrease in the direction perpendicular to the plane where the substrate 1 is located, the edge area of the lens layer 2 tends to be flat, that is, the flatness is higher. In the subsequent process for bonding the cover plate 12, it can further reduce the contact area between the bonding material and the lens layer 2, and increase the contact area between the bonding material and the flat area. Thereby improving the adhesion and the bonding stability, improving the quality of the display panel, and extending the service life of the display panel. In addition, the structural transition between the active area AA and the peripheral area BB of the display panel is more natural, which avoids uneven brightness in the edge area of the active area AA close to the peripheral area BB in the bright state of the display panel, and avoids the visible color differences in the junction area between the active area AA and the peripheral area BB due to the significant structural differences in the dark state of the display panel. Thus, further improving the aesthetics of the display panel.

In the display panel provided by the embodiment of the present application, shapes of graphs of orthographic projections of the second lenses 21 on the substrate 1 include ellipses, and extension directions of long axes of at least part of the ellipses in the peripheral area BB are different.

In exemplary embodiments, the extension directions of the long axes of at least part of the ellipses in the peripheral area BB are different, including but not limited to the following situations:

firstly, as shown in FIG. 6 and FIG. 13, in the peripheral area BB, the extension directions of the long axes of some ellipses (the graphs of the orthographic projections of the second lenses 21) are different, but the extension directions of the long axes of some other ellipses (the graphs of the orthographic projections of the second lenses 21) are the same;

secondly, as shown in FIG. 14, in the peripheral area BB, the extension directions of the long axes of all the ellipses (the graphs of the orthographic projections of the second lenses 21) are different.

In the display panel provided by the embodiment of the present application, by setting that the extension directions of the long axes of at least part of the ellipses in the peripheral area BB are different, the light that enters the second lenses 21 due to scattering or refraction can be scattered and emitted from the display panel. Which results in that the display brightness of the display panel from the active area AA to the junction of the peripheral area BB gradually decreases in the bright state, and the junction of the active area AA and the peripheral area BB will not have obvious black gaps due to a sudden decrease in the brightness, thereby improving the display effect of the display panel.

In the display panel provided by the embodiment of the present application, shapes of graphs of orthographic projections of the first lenses 22 on the substrate 1 include ellipses, and extension directions of long axes of at least part of the ellipses in the active area AA are the same.

In the display panel provided by the embodiment of the present application, by setting that the shapes of the graphs of the orthographic projections of the first lenses 22 on the substrate 1 include the ellipses, while the first lenses 22 converges the light emitted by the light emitting device Q, the ability of the first lenses 22 to converge the light along the long axis of the ellipse is different from the ability to converge the light along the short axis of the ellipse. In this way, the front view angle brightness of the display panel may be improved, and the light in the direction of the large viewing angle may be regulated to different degrees, which may meet the demand for more large angle brightness control of the display panel.

In exemplary embodiments, the extension directions of the long axes of at least part of the ellipses (the graphs of the orthographic projections of the first lenses 22) in the active area AA are the same, including but not limited to the following situations:

firstly, as shown in FIG. 14, the extension directions of the long axes of some ellipses (the graphs of the orthographic projections of the first lenses 22) in the active area AA are the same;

secondly, as shown in FIG. 6 and FIG. 13, the extension directions of the long axes of all the ellipses (the graphs of the orthographic projections of the first lenses 22) in the active area AA are the same.

In the display panel provided by the embodiment of the present application, by setting that the extension directions of the long axes of at least part of the ellipses in the active area AA are the same, in the active area AA, the ability of each first lens 22 to converge the light along the long axis of the ellipse is as consistent as possible, and the ability of each first lens 22 to converge the light along the short axis of the ellipse is as consistent as possible. Thus, improving the concentration of each first lens 22 to each light emitting device Q, improving the light emitting brightness of the display panel, and improving the display effect.

In the display panel provided by the embodiment of the present application, as shown in FIG. 13, structures and sizes of the first lenses 22 located at one side of an intersection boundary of the active area AA and the peripheral area BB are the same as structures and sizes of the second lenses 21 located at the other side of the intersection boundary.

In FIG. 13, two circle of lenses are provided at both sides of the intersection boundary of the active area AA and the peripheral area BB, by setting that the structures and the sizes of the first lenses 22 located at one side of the intersection boundary of the active area AA and the peripheral area BB are the same as the structures and the sizes of the second lenses 21 located at the other side of the intersection boundary, it can make the amount of light emitted into the second lenses 21 located at one side of the intersection boundary due to scattering or refraction approaches the amount of light emitted from the light emitting device Q into the first lenses 22. Which results in that the display brightness of the display panel from the active area AA to the junction of the peripheral area BB gradually decreases in the bright state, and the junction of the active area AA and the peripheral area BB will not have obvious black gaps due to a sudden decrease in the brightness, thereby improving the display effect of the display panel.

In the display panel provided by the embodiment of the present application, shapes of graphs of orthographic projections of the first lens 22 and the second lens 21 on the substrate 1 both include ellipses, and extension directions of long axes of the graphs of the orthographic projections of the first lenses 22 located at one side of the intersection boundary are the same as extension directions of long axes of the graphs of the orthographic projections of the second lenses 21 located at the other side of the intersection boundary.

In the display panel provided by the embodiment of the present application, by setting that the shapes of the graphs of the orthographic projections of the first lens 22 located at one side of the intersection boundary of the active area AA and the peripheral area BB and the second lens 21 located at the other side of the intersection boundary on the substrate 1 are both ellipses, and the extension directions of the long axes of the ellipses of the two are the same, it can make the amount of light emitted into the second lenses 21 located at one side of the intersection boundary due to scattering or refraction approaches the amount of light emitted from the light emitting device Q into the first lenses 22. Which results in that the display brightness of the display panel from the active area AA to the junction of the peripheral area BB gradually decreases in the bright state, and the junction of the active area AA and the peripheral area BB will not have obvious black gaps due to a sudden decrease in the brightness, thereby improving the display effect of the display panel.

In the display panel provided by the embodiment of the present application, as shown in FIG. 6, FIG. 13 and FIG. 14, the display panel includes a first encapsulation layer F1, a color filter layer CF and a second encapsulation layer F2 that are arranged in sequence, the first encapsulation layer F1 covers the light emitting devices Q and the cathode ring 31 and extends to the peripheral area of the display panel, the second encapsulation layer F2 is located between the color filter layer CF and the lens layer 2, and the second encapsulation layer F2 further extends to the peripheral area BB; and a roughness of at least part area of a surface of the second encapsulation layer F2 away from the substrate 1 is greater than a roughness of a surface of the first encapsulation layer F1 away from the substrate 1.

In exemplary embodiments, the first encapsulation layer F1 and the second encapsulation layer F2 are both a single-layer structure, and materials of them are inorganic materials.

For example, the materials of the first encapsulation layer F1 and the second encapsulation layer F2 may be one of silicon nitride, silicon oxide and silicon oxynitride.

For example, the materials of the first encapsulation layer F1 and the second encapsulation layer F2 may be the same.

Among them, the roughness of at least part area of the surface of the second encapsulation layer F2 away from the substrate 1 is greater than the roughness of the surface of the first encapsulation layer F1 away from the substrate 1, including but not limited to the following situations:

- firstly, the roughness of a part area of the surface of the second encapsulation layer F2 away from the substrate 1 is greater than the roughness of the surface of the first encapsulation layer F1 away from the substrate 1;
- secondly, the roughness of the whole area of the surface of the second encapsulation layer F2 away from the substrate 1 is greater than the roughness of the surface of the first encapsulation layer F1 away from the substrate 1.

In the display panel provided by the embodiment of the present application, the roughness of at least part area of the surface of the second encapsulation layer F2 away from the substrate 1 is greater than or equal to ten times the roughness of the surface of the first encapsulation layer F1 away from the substrate 1.

In some embodiments, preparation process parameters of the first encapsulation layer F1 and the second encapsulation layer F2 can be regulated, and the roughness of their surface can be controlled by controlling the uniformity of the thickness of the first encapsulation layer F1 and the second encapsulation layer F2.

For example, a difference between a minimum distance from the surface of the second encapsulation layer F2 away from the substrate 1 to the substrate 1 in a direction perpendicular to the substrate 1 and a maximum distance from the surface of the second encapsulation layer F2 away from the substrate 1 to the substrate 1 in the direction perpendicular to the substrate 1 may be controlled to be 500 Å-1000 Å. A difference between a minimum distance from the surface of the first encapsulation layer F1 away from the substrate 1 to the substrate 1 in the direction perpendicular to the substrate 1 and a maximum distance from the surface of the first encapsulation layer F1 away from the substrate 1 to the substrate 1 in the direction perpendicular to the substrate 1 may be controlled to be 50 Å-100 Å. It can be understood that the flatness of the surface of the second encapsulation layer F2 away from the substrate 1 is less than that of the surface of the first encapsulation layer F1 away from the substrate 1.

In exemplary embodiments, the color filter layer CF may include the first filter pattern, the second filter pattern, and the third filter pattern. One of the first filter pattern, the second filter pattern and the third filter pattern may be the red color blocking pattern, another is the green color blocking pattern, and yet another is the blue color blocking pattern. In addition, the color filter layer CF may further include a black matrix, and the black matrix may be provided between any two adjacent filter patterns, to prevent cross color of light with different colors. For example, the black matrix is provided between the first filter pattern and the second filter pattern, the black matrix is provided between the second filter pattern and the third filter pattern, and the black matrix is provided between the first filter pattern and the third filter pattern.

In the embodiment of the present application, by setting that the roughness of at least part area of the surface of the second encapsulation layer F2 away from the substrate 1 is greater than the roughness of the surface of the first encapsulation layer F1 away from the substrate 1, in the subsequent bonding process, the bonding material has better bonding strength with the second encapsulation layer F2 with higher roughness. Thereby, improving the adhesion and the bonding stability of the cover plate 12, improving the quality of the display panel, and extending the service life of the display panel.

In the display panel provided by the embodiment of the present application, as shown in FIG. 6, FIG. 13 and FIG. 14, the display panel further includes a bonding layer 11 and a cover plate 12, the bonding layer 11 is located at a side of the lens layer 2 away from the substrate 1, the cover plate 12 is located at a side of the bonding layer 11 away from the lens layer 2, an orthographic projection of the bonding layer 11 on the substrate 1 is located within an orthographic projection of the second encapsulation layer F2 on the substrate 1, and the bonding layer 11 is in direct contact with a part area of the second encapsulation layer F2 and the lens layer 2.

In exemplary embodiments, a material for bonding layer 11 includes the bonding materials, such as optical adhesives (OCA) or light-transmitting resins.

In the embodiment of the present application, by setting that the orthographic projection of the lens layer 2 on the substrate 1 is located within the area delineated by the outer contour of the orthographic projection of the cathode ring 31 on the substrate 1, setting that the bonding layer 11 is in direct contact with a part area of the second encapsulation layer F2 and the lens layer 2, respectively, and setting that the surface of the second encapsulation layer F2 away from the substrate 1 has a greater roughness, in the subsequent process for bonding the cover plate 12, because the surface of the lens layer 2 is not flat, the boundary of the lens layer contracted inwards can further reduce the contact area between the bonding material and the lens layer 2, and increase the contact area between the bonding material and the flat area. In addition, the surface of the second encapsulation layer F2 away from the substrate 1 has a greater roughness, which may greatly improve the adhesion of the bonding layer 11, thereby improving the bonding stability, improving the quality of the display panel, and extending the service life of the display panel.

In the display panel provided by the embodiment of the present application, an area of a region, in direct contact with the second encapsulation layer F2, of a portion of the bonding layer 11 located in the fourth peripheral subarea B4 is greater than or equal to an area of a region, in direct contact with second encapsulation layer F2, of a portion of the bonding layer 11 located in the first peripheral subarea B1.

In some embodiments, the area of the region, in direct contact with the second encapsulation layer F2, of the portion of the bonding layer 11 located in the fourth peripheral subarea B4 is equal to the area of the region, in direct contact with second encapsulation layer F2, of the portion of the bonding layer 11 located in the first peripheral subarea B1.

In some embodiments, the area of the region, in direct contact with the second encapsulation layer F2, of the portion of the bonding layer 11 located in the fourth peripheral subarea B4 is greater than the area of the region, in direct contact with second encapsulation layer F2, of the portion of the bonding layer 11 located in the first peripheral subarea B1.

In the embodiment of the present application, by setting that the area of the region, in direct contact with the second encapsulation layer F2, of the portion of the bonding layer 11 located in the fourth peripheral subarea B4 is greater than or equal to the area of the region, in direct contact with second encapsulation layer F2, of the portion of the bonding layer 11 located in the first peripheral subarea B1, in the subsequent binding process, when pressure and heating are applied to the local area of the fourth peripheral subarea B4, because the area of the region, in direct contact with the second encapsulation layer F2, of the portion of the bonding layer 11 located in the fourth peripheral subarea B4 is large, even if the heat in the binding process causes thermal expansion of the bonding material, after the superposition of the effects of the two factors, the adhesions between the cover plate 12 and the bonding layer 11 and between the bonding layer 11 and a underlying film layer do not decrease. Which further improves the bonding stability, improves the quality of the display panel, and extends the service life of the display panel.

In the display panel provided by the embodiment of the present application, as shown in FIG. 6, FIG. 13 and FIG. 14, the display panel further includes a light shield layer ZG, the light shield layer ZG is located in the peripheral area BB and surrounds the active area AA, and the light shield layer ZG and the color filter layer CF are arranged in a same layer; and the orthographic projection of the cathode ring 31 on the substrate 1 is located within an orthographic projection of the light shield layer ZG on the substrate 1, the outer contour of the orthographic projection of the lens layer 2 on the substrate 1 falls into an area where an orthographic projection of the light shield layer ZG on the substrate 1 is located, and an orthographic projection of an outer contour of the light shield layer ZG on the substrate 1 is located within an orthographic projection of the cover plate 12 on the substrate 1.

In some embodiments, the light shield layer ZG may include a single-layer structure, for example, the light shield layer ZG is prepared by the same material as the black matrix.

In some other embodiments, the light shield layer ZG may include a multi-layer structure, exemplary, the light shield layer ZG may include a plurality of sublayers. For example, the light shield layer ZG may include: a first sublayer prepared by using the same material as the red filter pattern, a second sublayer prepared by using the same material as the green filter pattern, and a third sublayer prepared by using the same material as the blue filter pattern that are arranged in stacked. Among them, there is no restriction on the order of arrangement of the first sublayer, the second sublayer, and the third sublayer here. For example, in the direction away from the substrate, the first sublayer, the second sublayer, and the third sublayer may be arranged in sequence. For example, in the direction away from the substrate, the first sublayer, the third sublayer, and the second sublayer may be arranged in sequence. For example, in the direction away from the substrate, the second sublayer, the first sublayer, and the third sublayer may be arranged in sequence. Certainly, other situations may also be included, which can be determined based on the preparation process sequence of the red filter pattern, the green filter patterns, and the blue filter patterns. For example, as shown in FIG. 6, FIG. 13, or FIG. 14, the light shield layer ZG may include the first sublayer prepared by using the same material as the red filter pattern and a second sublayer prepared by using the same material as the blue filter pattern that are arranged in stacked.

It should be noted that, the light shield layer ZG and the color filter layer CF are arranged in a same layer, which refers to that the light shield layer ZG and the color filter layer CF are formed in the same composition process, and does not mean that the thicknesses of the light shield layer ZG and the color filter layer CF are the same.

In an exemplary embodiment, the light shield layer ZG located in the peripheral area BB surrounds the active area AA. It can be understood that the shape of the projection of the light shield layer ZG can be a ring shape. There is no restriction on the specific shape of the above-mentioned ring shape here. For example, the ring shape can include a circular ring shape, an elliptical ring shape, a polygonal ring shape, etc.

In the embodiment of the present application, by setting the light shield layer ZG, the light shield layer ZG can block at least some of the circuits and wirings of the peripheral area BB, which avoids to reduce display effects caused by reflection.

Among them, the orthographic projection of the cathode ring 31 on the substrate 1 is located within the orthographic projection of the light shield layer ZG on the substrate 1, including but not limited to the following situations:

- firstly, the outer contour of the orthographic projection of the cathode ring 31 on the substrate 1 is located within the outer contour of the orthographic projection of the light shield layer ZG on the substrate 1;
- secondly, the outer contour of the orthographic projection of the cathode ring 31 on the substrate 1 overlaps with the outer contour of the orthographic projection of the light shield layer ZG on the substrate 1.

By setting that the orthographic projection of the cathode ring 31 on the substrate 1 is located within the orthographic projection of the light shield layer ZG on the substrate 1, the light shield layer ZG may block the cathode ring 31, thus avoiding to reduce the display effect caused by the reflection of the cathode ring 31.

In the display panel provided by the embodiment of the present application, as shown in FIG. 16, a shape of a graph of the orthographic projection of the cathode ring 31 on the substrate 1 includes polygons with rounded corners.

In the embodiment of the present application, by setting that the shape of the graph of the orthographic projection of the cathode ring 31 on the substrate 1 includes the polygons with rounded corners, the cathode ring 31 with a sharp conductive pattern which may increase the probability of electrostatic breakdown may be avoided. Thus, improving the stability of signal transmission in the display panel, and improving the product reliability of the display panel.

In the display panel provided by the embodiment of the present application, the display panel further includes a plurality of positive electrodes 7 located in the peripheral area BB, and the plurality of positive electrodes 7 and anodes of the light emitting devices Q are arranged in a same layer; wherein the positive electrodes 7 are electrically connected to the anodes, and the positive electrodes 7 are in direct contact with the cathode ring 31.

In the display panel provided by the embodiment of the present application, the cathode ring 31 is electrically connected with the cathode of each light-emitting device Q, and the area where the cathode ring 31 is located is marked as R area, where the positive electrode 7 is in direct contact with the cathode ring 31 to make the positive electrode 7 and the cathode ring 31 conductive, so as to form a closed-loop circuit between the light-emitting devices Q and the driving circuits of the display panel. In addition, the positive electrode 7 can be conducted with the anode of each light emitting device Q.

In addition to the content described above, the display panel provided by the embodiment of the present application can also include other structures such as an alignment marking pattern 4 of the cover plate, GOA circuit, etc. This specification only introduces the structures and components related to the invention point. The other structures and components included in the display panel can refer to the introduction in related art.

The embodiment of the present application provides a display device, including the display panel as described above.

The structure included in the display panel can be referred to the previous description, and will not be repeated here.

The display device also includes a flexible circuit board FPC and a driver chip IC.

Alternatively, the display panel includes a display control unit, and the display device also includes a flexible circuit board FPC.

In the exemplary embodiment, when the substrate 1 of the display panel is a silicon substrate, an array baseplate of the silicon substrate in the display device may integrate a pixel driver circuit array, a Source Driver, a Gate Driver, an Emission Control Driver, an oscillator (OSC), a Gamma Register, and a display control unit integrated circuit on the same chip. At this point, there is no need to set additional driver chips, and the display panel is directly electrically connected to the flexible circuit board FPC, which is called One Chip technology. The display device prepared by the One Chip technology has higher integration, but its size is smaller, which is suitable for high-resolution display products, such as virtual reality or augmented reality near-to-eye displays.

In the exemplary embodiment, when the substrate of the display panel is the silicon substrate, the array baseplate of the silicon substrate can also separate analog circuit parts such as the pixel driver circuit array, the Source driver, the Gate driver, the Emission driver (i.e., EOA unit of the present application) from the OSC, the Gamma register, an Interface, and the display control unit, and the One Chip technology is changed to Two Chip technology. At this point, the display panel needs to be electrically connected to the flexible circuit board FPC and the driver chip IC, respectively. Compared to products with One Chip technology, this type of product has lower manufacturing process requirements and can use low process technology to reduce production costs.

The display device can be a flexible display device (also known as a flexible screen) or a rigid display device (i.e., a display device that cannot be bent), and there is no limited here. The display device can be an OLED display device, and can also be any product or component with display functions, including OLED televisions, digital cameras, mobile phones, tablets, etc. The display device has the advantages of good display effect, long service life, and high stability.

The embodiment of the present application provides a wearable device, including two display devices as described above.

By setting that the orthographic projection of the lens layer 2 on the substrate 1 is located within the area delineated by the outer contour of the orthographic projection of the cathode ring 31 on the substrate 1, in the subsequent process of bonding the cover plate 12, because the surface of lens layer 2 is not flat, the wearable device may reduce the contact area between the bonding material and the lens layer 2, and increase the contact area between the bonding material and the flat area. Thus, improving the adhesion and the bonding stability, improving the quality of the wearable device, and extending the service life of the wearable device.

The above is only the specific implementation mode of the present application, but the scope of protection of the present application is not limited to this. Any changes or replacements can be easily thought by the technical personnel familiar with this technical field within the scope of technology disclosed in the present application should be covered within the scope of protection of the present application. Therefore, the protection scope of the present application should be based on the protection scope of the claims.

The invention claimed is:

1. A display panel, comprising an active area and a peripheral area, wherein the peripheral area surrounds the active area, and the display panel further comprises:

a substrate and a plurality of light emitting devices arranged on the substrate in array, wherein the plurality of light emitting devices are located at least in the active area;

a conducting layer comprising a cathode ring and cathodes of the plurality of light emitting devices, wherein the cathode ring is located in the peripheral area, and the cathode ring surrounds the active area; and a lens layer located at a side of the light emitting devices away from the substrate, wherein the lens layer extends from the active area to the peripheral area;

wherein an orthographic projection of the lens layer on the substrate is located within an area delineated by an outer contour of an orthographic projection of the cathode ring on the substrate;

wherein the orthographic projection of the lens layer on the substrate is located within an area delineated by an inner contour of the orthographic projection of the cathode ring on the substrate, and an outer contour of the orthographic projection of the lens layer on the substrate is located in the peripheral area.

2. The display panel according to claim 1, wherein the outer contour of the orthographic projection of the lens layer on the substrate overlaps with the inner contour of the orthographic projection of the cathode ring on the substrate.

3. The display panel according to claim 1, wherein a gap is provided between the outer contour of the orthographic projection of the lens layer on the substrate and the inner contour of the orthographic projection of the cathode ring on the substrate.

4. The display panel according to claim 3, wherein a size of the gap in a direction from the active area pointing to the peripheral area is less than or equal to a width of the cathode ring in the direction from the active area pointing to the peripheral area.

5. The display panel according to claim 4, wherein the size of the gap in the direction from the active area pointing to the peripheral area is greater than or equal to a size of one of the plurality of light emitting devices in the direction from the active area pointing to the peripheral area.

6. The display panel according to claim 3, wherein a part of the plurality of light emitting devices are located in the peripheral area, the light emitting devices located in the peripheral area are arranged in one circle along the edge of the active area, and the orthographic projection of the cathode ring on the substrate is located at a side, away from the active area, of an orthographic projection of each light emitting device located in the peripheral area on the substrate;

wherein the orthographic projections of the light emitting devices located in the peripheral area on the substrate are located within the orthographic projection of the lens layer on the substrate.

7. The display panel according to claim 3, wherein the peripheral area comprises a first peripheral subarea, a second peripheral subarea, a third peripheral subarea and a fourth peripheral subarea, the fourth peripheral subarea is disposed opposite to the first peripheral subarea, the second peripheral subarea is disposed opposite to the third peripheral subarea, and the fourth peripheral subarea comprises a binding terminal; and a width of a portion of the cathode ring located in the fourth peripheral subarea in a direction from the active area pointing to the peripheral area is less than or equal to widths of a portion of the cathode ring located in the peripheral area other than the fourth peripheral subarea in the direction from the active area pointing to the peripheral area.

8. The display panel according to claim 7, wherein the width of the portion of the cathode ring located in the fourth peripheral subarea in the direction from the active area pointing to the peripheral area is less than a width of a portion of the cathode ring located in the first peripheral subarea in the direction from the active area pointing to the peripheral area.

9. The display panel according to claim 7, wherein a graph of the orthographic projection of the lens layer on the substrate comprises a first side and a second side that are opposite to each other, an inner contour of a graph of the orthographic projection of the cathode ring on the substrate comprises a first edge and a second edge that are opposite to each other, the first side and the first edge are located in the second peripheral subarea, and the second side and the second edge are located in the third peripheral subarea; and a minimum distance between the first side and the first edge is different from a minimum distance between the second side and the second edge.

10. The display panel according to claim 7, wherein a graph of the orthographic projection of the lens layer on the substrate comprises a first side and a second side that are opposite to each other, an inner contour of a graph of the orthographic projection of the cathode ring on the substrate comprises a first edge and a second edge that are opposite to each other, the first side and the first edge are located in the second peripheral subarea, and the second side and the second edge are located in the third peripheral subarea; and a minimum distance between the first side and the first edge is equal to a minimum distance between the second side and the second edge; and a width of a portion of the cathode ring located in the second peripheral subarea in the direction from the active area pointing to the peripheral area is different from a width of a portion of the cathode ring located in the third peripheral subarea in the direction from the active area pointing to the peripheral area.

11. The display panel according to claim 7, wherein a graph of the orthographic projection of the lens layer on the substrate comprises a first side and a second side that are opposite to each other, an inner contour of a graph of the orthographic projection of the cathode ring on the substrate comprises a first edge and a second edge that are opposite to each other, the first side and the first edge are located in the second peripheral subarea, and the second side and the second edge are located in the third peripheral subarea; and a minimum distance between the first side and the first edge is equal to a minimum distance between the second side and the second edge; and a width of a portion of the cathode ring located in the second peripheral subarea in the direction from the active area pointing to the peripheral area is equal to a width of a portion of the cathode ring located in the third peripheral subarea in the direction from the active area pointing to the peripheral area.

12. The display panel according to claim 3, wherein the lens layer comprises a plurality of first lenses and a plurality of second lenses, the plurality of first lenses are located in the active area, and the plurality of second lenses are located in the peripheral area; and a height of each of the plurality of second lenses in a direction perpendicular to a plane where the substrate is located is less than or equal to a height of each of the plurality of first lenses in the direction perpendicular to the plane where the substrate is located.

13. The display panel according to claim 12, wherein in the direction from the active area pointing to the peripheral area, heights of the plurality of second lenses gradually decrease in the direction perpendicular to the plane where the substrate is located.

14. The display panel according to claim 12, wherein shapes of graphs of orthographic projections of the second lenses on the substrate comprise ellipses, and extension directions of long axes of at least part of the ellipses in the peripheral area are different.

15. The display panel according to claim 12, wherein shapes of graphs of orthographic projections of the first lenses on the substrate comprise ellipses, and extension directions of long axes of at least part of the ellipses in the active area are the same.

16. The display panel according to claim 12, wherein structures and sizes of the first lenses located at one side of an intersection boundary of the active area and the peripheral area are the same as structures and sizes of the second lenses located at the other side of the intersection boundary.

17. The display panel according to claim 16, wherein shapes of graphs of orthographic projections of the first lens and the second lens on the substrate both comprise ellipses, and extension directions of long axes of the graphs of the orthographic projections of the first lenses located at one side of the intersection boundary are the same as extension directions of long axes of the graphs of the orthographic projections of the second lenses located at the other side of the intersection boundary.

18. A display device, comprising the display panel according to claim 1.

19. A wearable device, comprising two display devices according to claim 18.

* * * * *